United States Patent
Chang et al.

(10) Patent No.: US 12,073,169 B2
(45) Date of Patent: Aug. 27, 2024

(54) ANTI-FUSE ARRAY

(71) Applicant: TAIWAN SEMICONDUCTOR MANUFACTURING COMPANY, LTD., Hsinchu (TW)

(72) Inventors: Meng-Sheng Chang, Hsinchu (TW); Shao-Yu Chou, Hsinchu (TW); Yao-Jen Yang, Hsinchu (TW); Chen-Ming Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/446,684

(22) Filed: Aug. 9, 2023

(65) Prior Publication Data

US 2023/0385510 A1 Nov. 30, 2023

Related U.S. Application Data

(62) Division of application No. 17/178,973, filed on Feb. 18, 2021, now Pat. No. 11,783,107, which is a
(Continued)

(51) Int. Cl.
*G06F 7/50* (2006.01)
*G06F 30/392* (2020.01)
(Continued)

(52) U.S. Cl.
CPC ............ *G06F 30/392* (2020.01); *G11C 17/16* (2013.01); *G11C 17/18* (2013.01); *H01L 23/528* (2013.01); *H10B 20/20* (2023.02); *H01L 23/5252* (2013.01)

(58) Field of Classification Search
USPC ............................. 716/51, 55, 111, 119, 126
See application file for complete search history.

(56) References Cited

U.S. PATENT DOCUMENTS 7,260,442 B2    8/2007   Hwang et al.
9,196,377 B1 *  11/2015  Park ...................... G11C 17/18
(Continued)

FOREIGN PATENT DOCUMENTS

DE    102016103820    9/2016
KR    20090094372     9/2009
(Continued)

OTHER PUBLICATIONS

Office Action dated Jul. 2, 2020 from corresponding application No. DE 102019101570.7.

*Primary Examiner* — Brian Ngo
(74) *Attorney, Agent, or Firm* — Hauptman Ham, LLP

(57) ABSTRACT

An anti-fuse array includes first through fourth adjacent anti-fuse bit columns, the anti-fuse bits of the first and second anti-fuse bit columns including portions of active areas of a first active area column, and the anti-fuse bits of the third and fourth anti-fuse bit columns including portions of active areas of a second active area column. Each row of a first set of conductive segment rows includes first and second conductive segments positioned between adjacent active areas of the first active area column and a third conductive segment positioned between adjacent active areas of the second active area column. Each row of a second set of conductive segments alternating with the first set of conductive segment rows includes a fourth conductive segment positioned between adjacent active areas of the first active area column and fifth and sixth conductive segments positioned between adjacent active areas of the second active area column.

20 Claims, 12 Drawing Sheets

Related U.S. Application Data division of application No. 16/252,291, filed on Jan. 18, 2019, now Pat. No. 10,929,588.

(60) Provisional application No. 62/630,160, filed on Feb. 13, 2018.

(51) Int. Cl.
*G11C 17/16* (2006.01)
*G11C 17/18* (2006.01)
*H01L 23/528* (2006.01)
*H10B 20/20* (2023.01)
*H01L 23/525* (2006.01)

(56) References Cited

U.S. PATENT DOCUMENTS

| | | |
|---|---|---|
| 9,256,709 B2 | 2/2016 | Yu et al. |
| 9,406,397 B1 * | 8/2016 | Ju .................... H10B 20/20 |
| 2009/0180307 A1 | 7/2009 | Kurjanowicz |
| 2011/0103127 A1 * | 5/2011 | Kurjanowicz ......... G11C 17/16 257/209 |
| 2012/0124528 A1 | 5/2012 | Wang et al. |
| 2014/0035014 A1 | 2/2014 | Jeon |
| 2014/0040838 A1 | 2/2014 | Liu et al. |
| 2015/0278429 A1 | 10/2015 | Chang |
| 2016/0078164 A1 | 3/2016 | Hsieh et al. |
| 2016/0300843 A1 * | 10/2016 | Jung ..................... H10B 20/20 |
| 2016/0343723 A1 | 11/2016 | Briggs et al. |
| 2017/0154686 A1 * | 6/2017 | Liaw .................. H01L 29/7851 |
| 2018/0061755 A1 | 3/2018 | Yamamoto et al. |
| 2019/0165045 A1 | 5/2019 | Chung |

FOREIGN PATENT DOCUMENTS

| | | |
|---|---|---|
| KR | 20140018575 | 2/2014 |
| KR | 20160031401 | 3/2016 |

* cited by examiner

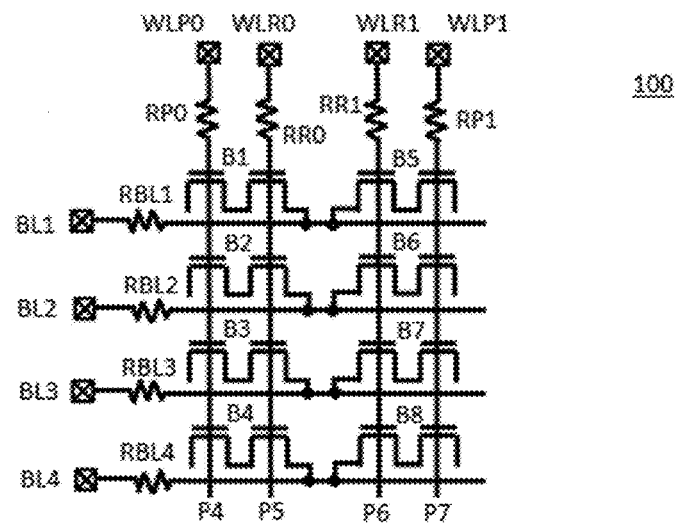
FIG. 1F
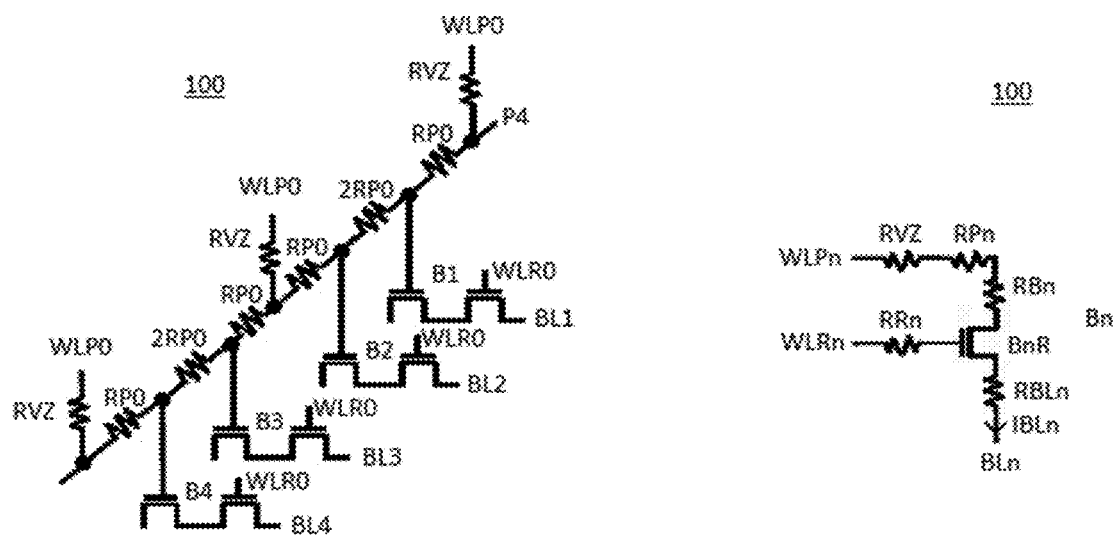
FIG. 1G
FIG. 1H

ANTI-FUSE ARRAY

PRIORITY CLAIM

The present application is a divisional of U.S. application Ser. No. 17/178,973, filed Feb. 18, 2021, which is a divisional of U.S. application Ser. No. 16/252,291, filed Jan. 18, 2019, now U.S. Pat. No. 10,929,588, issued Feb. 23, 2021, which claims the priority of U.S. Provisional Application No. 62/630,160, filed Feb. 13, 2018, each of which is incorporated herein by reference in its entirety.

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1F-1H are schematic diagrams of portions of an anti-fuse cell array, in accordance with some embodiments.

FIGS. 3A-3D are diagrams of anti-fuse arrays, in accordance with some embodiments.

DETAILED DESCRIPTION

Figure 1A:
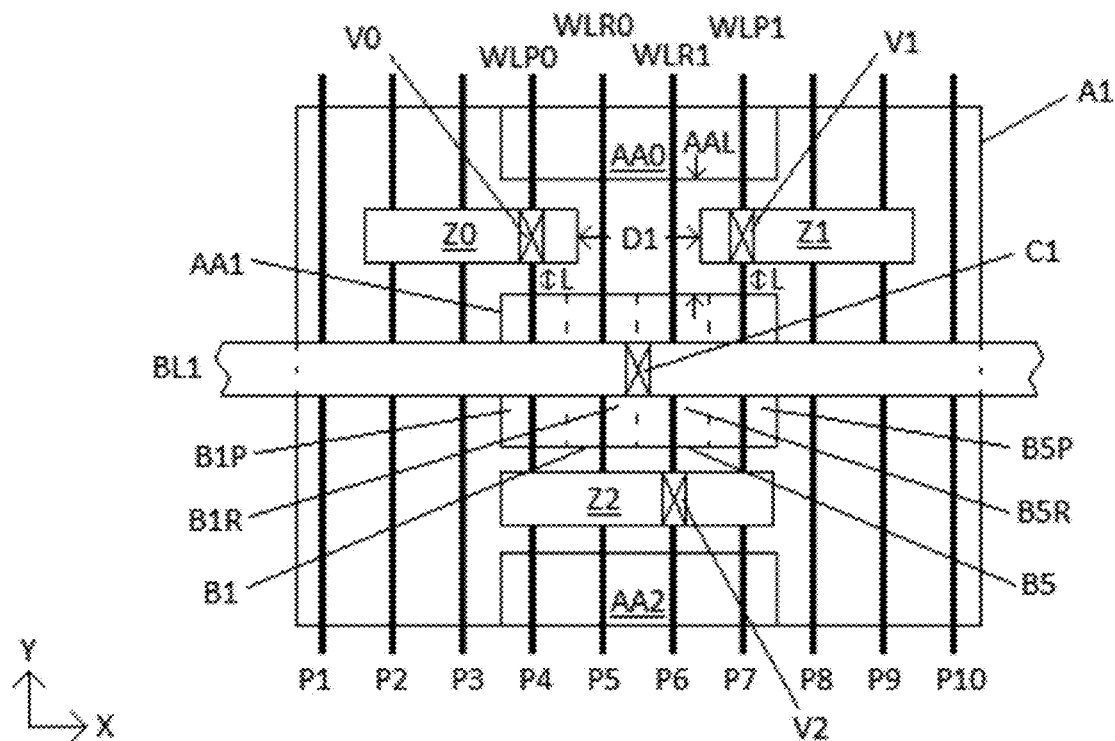
FIG. 1A is a diagram of an anti-fuse cell, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, IC layouts and anti-fuse structures and arrays manufactured from the IC layouts include a gate structure segment between each anti-fuse structure and a nearest electrical connection that is shorter than a distance between adjacent active areas containing anti-fuse structures. Compared to approaches that include gate structure segments longer than a distance between adjacent active areas, currents in read operations are increased and more uniform based on the uniformly low resistance of the gate structure segment connected to each anti-fuse structure.

FIG. 1A is a diagram of an anti-fuse cell A1, in accordance with some embodiments. FIG. 1A depicts a plan view of an IC layout diagram of anti-fuse cell A1, an X direction, a Y direction perpendicular to the X direction, a bit line BL1 extending in the X direction, and gate regions P1-P10 extending in the Y direction.

In various embodiments, anti-fuse cell A1 is a standalone cell, e.g., a standard cell stored in a cell library, or is a part of a larger IC layout diagram, e.g., a standard cell or other circuit including features in addition to those depicted in FIG. 1A. In some embodiments, anti-fuse cell A1 is included in an anti-fuse cell array, e.g., an anti-fuse cell array 100, discussed below with respect to FIGS. 1C and 1D.

In various embodiments, the portion of bit line BL1 overlying anti-fuse cell A1 is either included or not included in the IC layout diagram of anti-fuse cell A1, and the portions of some or all of gate regions P1-P10 overlying anti-fuse cell A1 are either included or not included in the IC layout diagram of anti-fuse cell A1.

Anti-fuse cell A1 includes active regions AA0, AA1, and AA2 and conductive regions Z0, Z1, and Z2. Active regions AA0, AA1, and AA2 extend in the X direction and are aligned with each other in the Y direction. Conductive regions Z0 and Z1 extend in the X direction, are aligned with each other in the X direction, and are positioned between adjacent active regions AA0 and AA1. Conductive region Z2 extends in the X direction and is positioned between adjacent active regions AA1 and AA2.

Each active region AA0, AA1, and AA2 is a region in the IC layout diagram included in a manufacturing process as part of defining an active area, also referred to as an oxide diffusion or definition (OD), in a semiconductor substrate in which one or more IC device features, e.g., a source/drain region, is formed. In various embodiments, an active area is an n-type or p-type active area of a planar transistor or a fin, field-effect transistor (FinFET). In some embodiments, active region AA1 is included in a manufacturing process as part of defining an active area 5AA1 discussed below with respect to FIG. 5A.

Each gate region P1-P10 is a region in the IC layout diagram included in the manufacturing process as part of defining a gate structure in the IC device including at least one of a conductive material or a dielectric material. In various embodiments, one or more gate structures corresponding to gate regions P1-P10 includes at least one conductive material overlying at least one dielectric material. In some embodiments, gate regions P4-P7 are included in a manufacturing process as part of defining respective gate structures 5P4-5P7 discussed below with respect to FIGS. 5A-5C.

In the embodiment depicted in FIG. 1A, each gate region P4-P7 overlies each active region AA0, AA1, and AA2. In various embodiments, one or more of gate regions P4-P7 does not overlie one or more of active regions AA0, AA1, or AA2, or one or more gate regions (not shown) in addition to gate regions P4-P7 overlies one or more of active regions AA0, AA1, or AA2.

In the embodiment depicted in FIG. 1A, each gate region P1-P3 and P8-P10 does not overlie any of active regions AA0, AA1, or AA2. In various embodiments, one or more of gate regions P1-P3 or P8-P10 overlies one or more of active regions AA0, AA1, or AA2. In various embodiments, anti-fuse cell A1 includes one or more gate regions (not shown) in addition to gate regions P1-P10, and/or anti-fuse cell A1 does not include one or more of gate regions P1-P3 or P8-P10.

Each conductive region Z0, Z1, and Z2, and bit line BL1 is a region in the IC layout diagram included in the manufacturing process as part of defining one or more segments of one or more conductive layers in the IC device. In various embodiments, one or more of conductive regions Z0, Z1, or Z2, or bit line BL1 corresponds to one or more segments of a same or different conductive layers in the IC device. In various embodiments, one or more of conductive regions Z0, Z1, or Z2, or bit line BL1 corresponds to one or more of a metal zero, a metal one, or a higher metal layer in the IC device. In some embodiments, conductive regions Z0 and Z1 and bit line BL1 are included in a manufacturing process as part of defining conductive segments 5Z0 and 5Z1 and conductive segment 5BL, respectively, discussed below with respect to FIGS. 5A-5C.

Conductive region Z0 overlies each gate region P2-P4, and a conductive region V0 is positioned at the location at which conductive region Z0 overlies gate region P4. Conductive region Z1 overlies each gate region P7-P9, and a conductive region V1 is positioned at the location at which conductive region Z1 overlies gate region P7. Conductive region Z2 overlies each gate region P4-P7, and a conductive region V2 is positioned at the location at which conductive region Z2 overlies gate region P6.

Each conductive region V0, V1, and V2 is a region in the IC layout diagram included in the manufacturing process as part of defining one or more segments of one or more conductive layers in the IC device configured to form an electrical connection between one or more conductive layer segments corresponding to a respective conductive region Z0, Z1, or Z2, and a gate structure corresponding to a respective gate region P4, P7, or P6. In various embodiments, the one or more conductive layer segments formed based on each conductive region V0, V1, and V2 includes a via between a corresponding gate structure and a corresponding segment in an overlying metal layer, e.g., a metal zero layer, of the IC device. In some embodiments, conductive regions V0 and V1 are included in a manufacturing process as part of defining respective vias 5V0 and 5V1 discussed below with respect to FIGS. 5A and 5C.

Conductive regions Z0 and Z1 are separated by a distance D1 in the X direction. Distance D1 has a value equal to or greater than a predetermined distance based on one or more design rules for the conductive layer that includes conductive regions Z0 and Z1. In various embodiments, the predetermined distance is based on one or a combination of a minimum spacing rule for a metal layer, e.g., a metal zero layer, or a minimum spacing rule for a circuit design-based voltage difference between conductive regions Z0 and Z1. In a non-limiting example, a minimum spacing rule for a circuit design-based voltage difference is a minimum distance between two conductors configured so that one of the two conductors is capable of carrying a power supply voltage level and the other of the two conductors is capable of carrying a reference or ground voltage level.

Bit line BL1 overlies active region AA1, and a conductive region C1 is positioned over active region AA1 between gate regions P5 and P6. Conductive region C1 is a region in the IC layout diagram included in the manufacturing process as part of defining one or more segments of one or more conductive layers in the IC device configured to form an electrical connection between the one or more segments based on bit line BL1 and the active area based on active region AA1. In various embodiments, the one or more conductive layer segments formed based on conductive region C1 includes a contact between the active area based on active region AA1 and the one or more segments based on bit line BL1 in an overlying metal layer, e.g., a metal zero layer, of the IC device. In some embodiments, conductive region C1 is included in a manufacturing process as part of defining a contact 5C1 discussed below with respect to FIGS. 5A and 5B.

By the configuration discussed above, an IC device manufactured based on anti-fuse cell A1 includes anti-fuse bits B1 and B5 positioned within the active area based on active region AAL. Anti-fuse bit B1 includes an anti-fuse structure B1P and a transistor B1R, and anti-fuse bit B5 includes an anti-fuse structure B5P and a transistor B5R.

In various embodiments, anti-fuse cell A1 is configured such that one or both of active regions AA0 or AA2, in combination with one or more active regions of one or more cells adjacent to anti-fuse cell A1, e.g., an anti-fuse cell A2 discussed below with respect to FIG. 1C, includes one or more anti-fuse bits (not labeled in FIG. 1A) in addition to anti-fuse bits B1 and B5.

Anti-fuse structure B1P is formed at the location at which gate region P4 intersects active region AA1 and is based on the portion of gate region P4 that overlies active region AA1, a first portion of active region AA1 adjacent to gate region P4 in the negative X direction, and a second portion of active region AA1 extending from gate region P4 to gate region P5 in the X direction. In some embodiments, gate region P4 overlies active region AA1 along the left edge of active region AA1 such that anti-fuse structure B1P does not include an active area portion corresponding to active region AA1 adjacent to gate region P4 in the negative X direction.

At least a portion of the gate structure corresponding to gate region P4 and overlying the active area corresponding to region AA1 includes a layer of one or more dielectric materials configured so that, in operation, a sufficiently large electric field across the dielectric layer sustainably alters a dielectric material, thereby significantly decreasing the resistance of the dielectric layer from a level prior to application of the electric field. Sustainably altering the dielectric material is also referred to as breaking down the dielectric material, in some embodiments.

In some embodiments in which anti-fuse structure B1P includes an active area portion corresponding to active region AA1 adjacent to gate region P4 in the negative X direction, anti-fuse structure B1P is referred to as a programming transistor. In some embodiments, e.g., embodiments in which anti-fuse structure B1P does not include an active area portion corresponding to active region AA1 adjacent to gate region P4 in the negative X direction, anti-fuse structure B1P is referred to as a programming capacitor.

Transistor B1R is formed at the location at which gate region P5 intersects active region AA1 and is based on the portion of gate region P5 that overlies active region AA1, the second portion of active region AA1 extending from gate region P4 to gate region P5, and a third portion of active region AA1 extending from gate region P5 to gate region P6 in the X direction.

Transistor B1R is electrically connected with anti-fuse structure B1P through the active area portion corresponding to active region AA1 between gate regions P4 and P5, and electrically connected with the one or more segments corresponding to bit line BL1 through the active area portion corresponding to active region AA1 between gate regions P5 and P6 in series with the one or more conductive segments corresponding to conductive region C1.

The gate structure corresponding to gate region P5 is thereby configured as the gate of transistor B1R and is responsive to a signal WLR0. The gate structure corresponding to gate region P4 is thereby configured as a terminal of anti-fuse structure B1P and is responsive to a signal WLP0.

Anti-fuse structure B5P and transistor B5R of anti-fuse bit B5 are formed at the respective locations at which gate regions P7 and P6 intersect active region AA1, and are configured in the manner described above with respect to anti-fuse bit B1 such that the gate structure corresponding to gate region P6 is configured as the gate of transistor B5R responsive to a signal WLR1 and the gate structure corresponding to gate region P7 is configured as a terminal of anti-fuse structure B5P responsive to a signal WLP1.

Each of a gate structure portion corresponding to gate region P4 between conductive region V0 and anti-fuse bit B1 and a gate structure portion corresponding to gate region P7 between conductive region V1 and anti-fuse bit B5 has a length L. Adjacent active regions AA0 and AA1 are separated by a distance AAL. Because conductive regions V0 and V1 are positioned between adjacent active regions AA0 and AA1, length L is shorter than distance AAL.

Figure 1B:
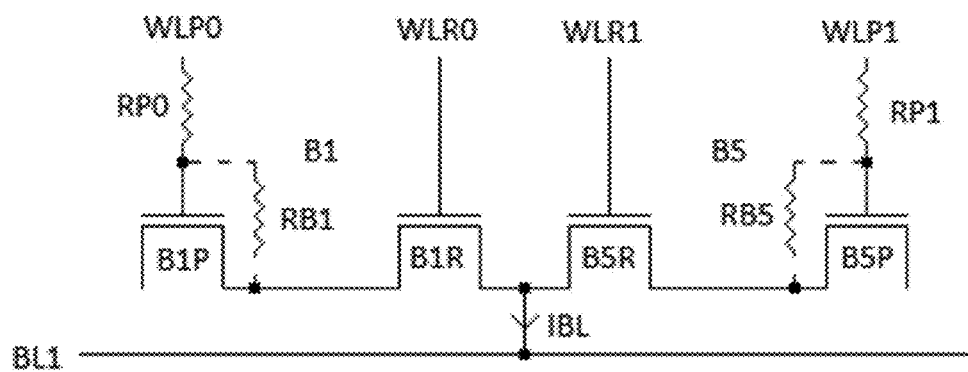
FIG. 1B is a schematic diagram of a portion of an anti-fuse cell, in accordance with some embodiments.

FIG. 1B is a schematic diagram of the portion of anti-fuse cell A1 corresponding to anti-fuse bits B1 and B5, in accordance with some embodiments. As depicted in FIG. 1B, bit line BL1 is electrically connected with first source/drain terminals of each of transistors B1R and B5R in the active area portion corresponding to active region AA1 between gate regions P5 and P6. The second source/drain terminal of transistor B1R is electrically connected with a source/drain terminal of anti-fuse structure B1P in the active area portion corresponding to active region AA1 between gate regions P4 and P5, and the second source/drain terminal of transistor B5R is electrically connected with a source/drain terminal of anti-fuse structure B5P in the active area portion corresponding to active region AA1 between gate regions P6 and P7.

The gate structure portion corresponding to gate region P4 between conductive region V0 and anti-fuse bit B1 is represented as a resistor RP0, and the gate structure portion corresponding to gate region P7 between conductive region V1 and anti-fuse bit B5 is represented as a resistor RP1.

In programming and read operations on anti-fuse bit B1, signal WLP0 is applied to anti-fuse structure BP through resistor RP0, transistor B1R is turned on responsive to signal WLR0 applied through the gate structure corresponding to gate region P5, and a reference voltage is applied to bit line BL1. In programming and read operations on anti-fuse bit B5, signal WLP1 is applied to anti-fuse structure B5P through resistor RP1, transistor B5R is switched on responsive to signal WLR1 applied through the gate structure corresponding to gate region P6, and the reference voltage level is applied to bit line BL1.

In programming and read operations on either of anti-fuse bits B1 or B5, a current IBL flows to bit line BL1. Magnitudes and polarities of current IBL are based on magnitudes and polarities of signals WLP0 and WLP1 relative to the reference voltage applied to bit line BL1, and on path resistance values presented either by the series of resistor RP0, anti-fuse structure B1P, and transistor B1R, or by the series of resistor RP1, anti-fuse structure B5P, and transistor B5R.

In the embodiment depicted in FIG. 1B, anti-fuse structures B1P and B5P and transistors B1R and B5R are NMOS devices, transistors B1R and B5R thereby being configured to be switched on in response to a respective signal WLR0 or WLR1 having a sufficiently large positive value relative to the reference voltage level. In some embodiments, anti-fuse structures B1P and B5P and transistors B1R and B5R are PMOS devices, transistors B1R and B5R thereby being configured to be switched on in response to a respective signal WLR0 or WLR1 having a sufficiently large negative value relative to the reference voltage level.

In a programming operation, signal WLP0 or WLP1 has a programming voltage level such that a difference between the programming voltage level and the reference voltage level produces an electric field across the dielectric layer of the corresponding anti-fuse structure B1P or B5P sufficiently large to sustainably alter the dielectric material, the resultant lowered resistance being represented in FIG. 1B as a respective resistor RB1 or RB5.

In a read operation, signal WLP0 or WLP1 has a read voltage level such that a difference between the read voltage level and the reference voltage level produces an electric field that is sufficiently small to avoid sustainably altering the dielectric material of the corresponding anti-fuse structure B1P or B5P, and sufficiently large to generate current IBL having a magnitude capable of being sensed by a sense amplifier (not shown) and thereby used to determine a programmed status of the corresponding anti-fuse structure B1P or B5P.

In various embodiments, one or both of the programming or read voltage levels is either positive relative to the reference voltage level or negative relative to the reference voltage level.

By the configuration discussed above, in operation, signal WLR1 is provided to transistor B5R through the conductive segments corresponding to conductive regions Z2 and V2 and the gate structure corresponding to gate region P6, and signal WLR0 is provided to transistor B1R through the gate structure corresponding to gate region P5 and conductive segments corresponding to features of an adjacent cell, e.g., anti-fuse cell A2 discussed below with respect to FIG. 1C.

In the embodiment depicted in FIG. 1A, anti-fuse bits B1 and B5 are formed based on active region AA1 and the other features of anti-fuse cell A1 configured as discussed above. In various embodiments, anti-fuse cell A1 includes anti-fuse bits B1 and B5 formed based on active region AA1 otherwise configured so as to be capable of being programmed and read by the programming and read operations discussed above.

In the embodiment depicted in FIG. 1A, anti-fuse cell A1 includes conductive region V2 positioned at the location at which conductive region Z2 overlies gate region P6. In some embodiments, anti-fuse cell A1 includes conductive region V2 positioned at the location at which conductive region Z2 overlies gate region P5, anti-fuse cell A1 thereby having a configuration corresponding to being rotated 180 degrees about an axis extending in the Y direction, and corresponding to that of an anti-fuse cell A2, discussed below with respect to FIG. 1C.

In the embodiment depicted in FIG. 1A, anti-fuse cell A1 includes conductive regions Z2 and V2 positioned between active regions AA2 and AA1 along the Y direction, and conductive regions Z0, V0, Z1, and V1 positioned between active regions AA1 and AA0 along the Y direction.

Figure 1C:
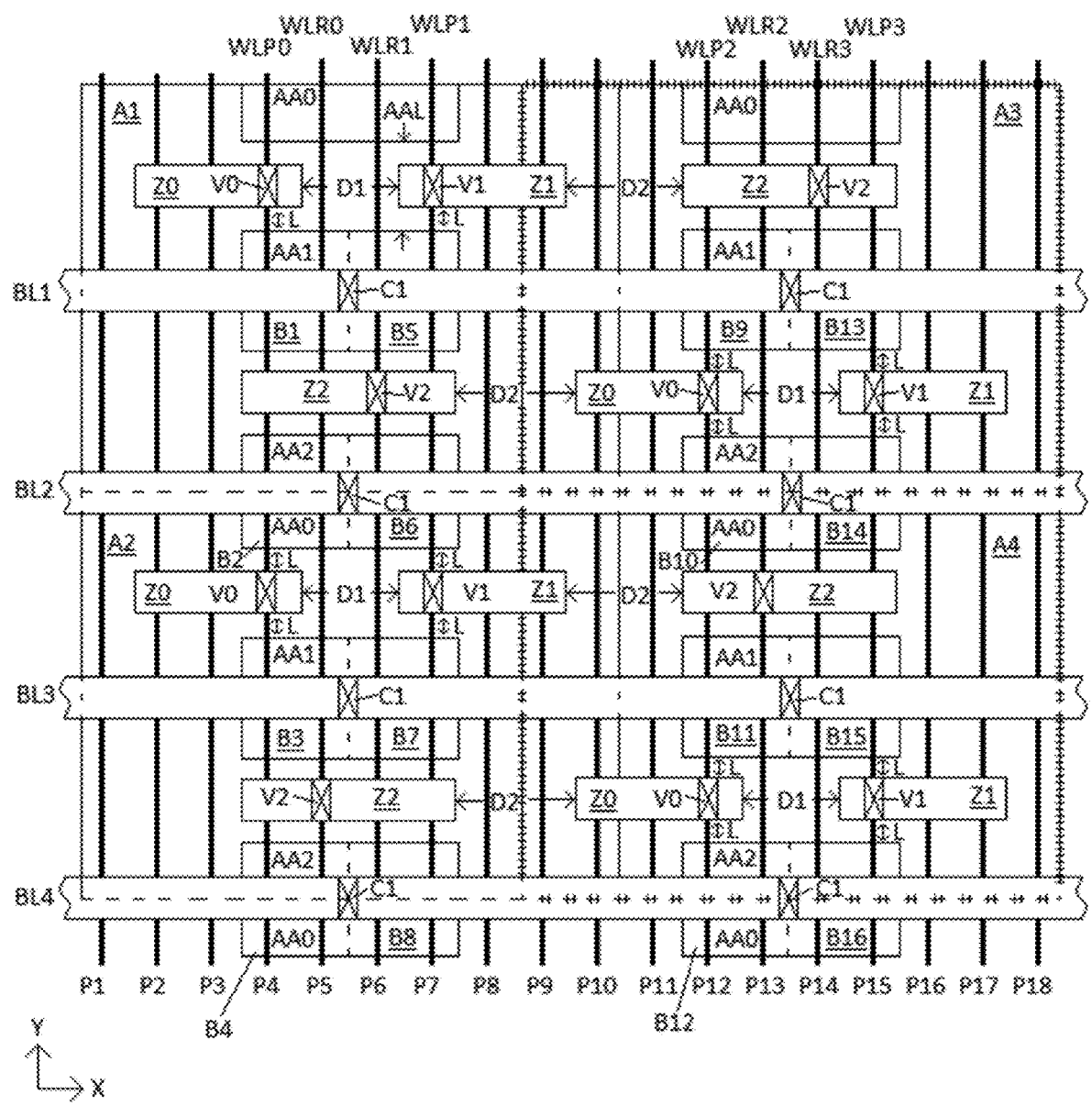
FIGS. 1C-1E are diagrams of an anti-fuse cell array, in accordance with some embodiments.

In some embodiments, anti-fuse cell A1 includes conductive regions Z0, V0, Z1, and V1 positioned between active regions AA2 and AA1 along the Y direction, conductive regions Z2 and V2 positioned between active regions AA1 and AA0 along the Y direction, and conductive region V2 positioned at the location at which conductive region Z2 overlies gate region P6, anti-fuse cell A1 thereby having a configuration corresponding to being rotated 180 degrees about an axis extending in the X direction, and corresponding to that of an anti-fuse cell A3, discussed below with respect to FIG. 1C.

In some embodiments, anti-fuse cell A1 includes conductive regions Z0, V0, Z1, and V1 positioned between active regions AA2 and AA1 along the Y direction, conductive regions Z2 and V2 positioned between active regions AA1 and AA0 along the Y direction, and conductive region V2 positioned at the location at which conductive region Z2 overlies gate region P5, anti-fuse cell A1 thereby having a configuration corresponding to being rotated 180 degrees about an axis extending in the X direction and 180 degrees about an axis extending in the Y direction, and corresponding to that of an anti-fuse cell A4, discussed below with respect to FIG. 1C.

By each of the configurations discussed above, the programming and read current path of anti-fuse bit B1 includes the portion of the gate structure corresponding to gate region P4 having length L, and the programming and read current path of anti-fuse bit B5 includes the portion of the gate structure corresponding to gate region P7 having length L.

Conductive regions V0 and V1 and active region AA1 thereby define gate structure portions of the programming and read current paths of anti-fuse bits B1 and B5 that are shorter than the distance between adjacent active areas and do not overlie active areas in addition to the active area corresponding to active region AA1. Thus, the programming and read current paths of anti-fuse bits B1 and B5 are shorter, and thereby less resistive, than programming and read current paths in approaches in which at least one gate structure portion overlies one or more active areas in addition to an active area including the corresponding anti-fuse bit.

By being less resistive than programming and read current paths in such other approaches, the programming and read current paths of anti-fuse bits B1 and B5 reduce overall parasitic path resistance, thereby improving the reliability of programming and read operations compared to the other approaches.

Further, because the gate structure portions of the read current paths of anti-fuse bits B1 and B5 have the same length L, read current path resistance values for anti-fuse bits B1 and B5 have less variability than in approaches in which gate structure portions of read current paths of anti-fuse bits have significantly different lengths. Accordingly, for a given read voltage level, read current values for read operations on anti-fuse bits B1 and B5 have less variability than in approaches in which gate structure portions of read current paths of anti-fuse bits have significantly different lengths.

Figure 1D:
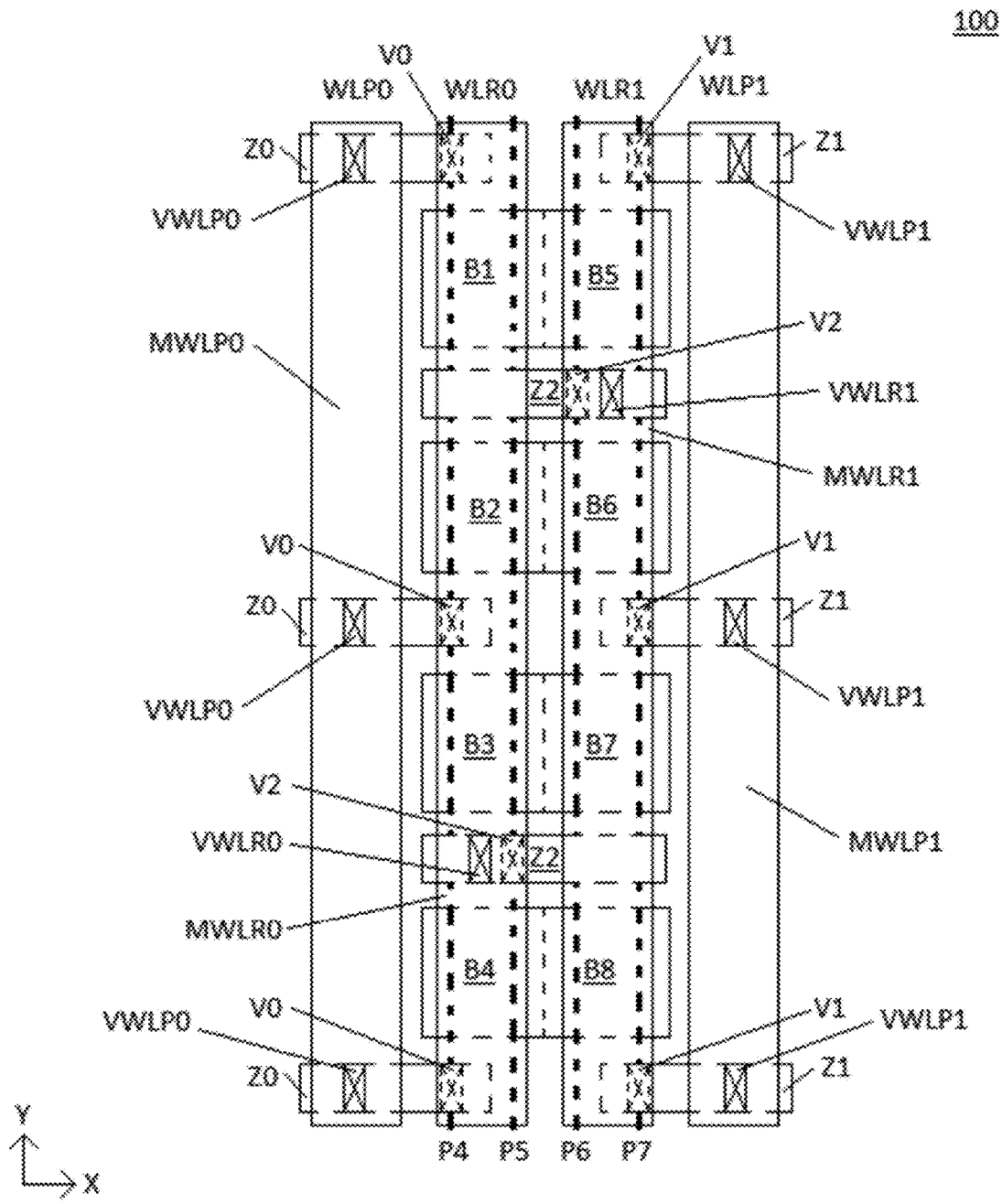

FIGS. 1C and 1D are diagrams of anti-fuse cell array 100, in accordance with some embodiments. FIGS. 1C and 1D depict plan views of differing portions of an IC layout diagram of anti-fuse cell array 100, based on anti-fuse cell A1, and the X and Y directions, each discussed above with respect to FIG. 1A.

In addition to anti-fuse cell A1, gate regions P1-P10, bit line BL1, and the X and Y directions discussed above with respect to FIG. 1A, FIG. 1C depicts anti-fuse cells A2-A4, gate regions P11-P18 parallel to gate regions P1-P10, and bit lines BL2-BL4 parallel to bit line BL1.

FIG. 1D depicts anti-fuse cells A1 and A2, simplified for the purpose of clarity, gate regions P4-P7, and conductive regions MWLP0, MWLR0, MWLR1, MWLP1, VWLP0, VWLR0, VWLR1, and VWLP1.

FIG. 1C depicts anti-fuse cells A1 and A2 with smooth borders and anti-fuse cells A3 and A4 with patterned borders. Anti-fuse cell A2 is positioned adjacent to and abutting anti-fuse cell A1 in the negative Y direction. Anti-fuse cell A3 is positioned adjacent to and overlapping anti-fuse cell A1 in the positive X direction. Anti-fuse cell A4 is positioned adjacent to and abutting anti-fuse cell A3 in the negative Y direction and adjacent to and overlapping anti-fuse cell A2 in the positive X direction.

Anti-fuse cell A1 is an embodiment of anti-fuse cell A1 having the configuration depicted in FIG. 1A, and each of anti-fuse cells A2-A4 is an embodiment of anti-fuse cell A1 having one of the other configurations discussed above with respect to anti-fuse cell A1.

Anti-fuse cell A2 has a configuration of anti-fuse cell A1 in which conductive regions Z0, V0, Z1, and V1 are positioned between active regions AA1 and AA0 along the Y direction, conductive regions Z2 and V2 are positioned between active regions AA2 and AA1 along the Y direction, and conductive region V2 is positioned at the location at which conductive region Z2 overlies gate region P5.

Anti-fuse cell A3 has a configuration of anti-fuse cell A1 in which conductive regions Z0, V0, Z1, and V1 are positioned between active regions AA2 and AA1 along the Y direction, conductive regions Z2 and V2 are positioned between active regions AA1 and AA0 along the Y direction, and conductive region V2 is positioned at the location at which conductive region Z2 overlies gate region P14.

Anti-fuse cell A4 has a configuration of anti-fuse cell A1 in which conductive regions Z0, V0, Z1, and V1 are positioned between active regions AA2 and AA1 along the Y direction, conductive regions Z2 and V2 are positioned between active regions AA1 and AA0 along the Y direction, and conductive region V2 is positioned at the location at which conductive region Z2 overlies gate region P13.

Each bit line BL1 and BL2 overlies anti-fuse cells A1 and A3, and each bit line BL2-BL4 overlies anti-fuse cells A2 and A4 such that bit line BL2 overlies each anti-fuse cell A1-A4. Each gate region P1-P10 overlies anti-fuse cells A1 and A2, and each gate region P9-P18 overlies anti-fuse cells A3 and A4 such that each gate region P9 and P10 overlies each anti-fuse cell A1-A4.

In various embodiments, some or all of the portions of bit lines BL1-BL4 overlying corresponding anti-fuse cells A1-A4 are included or not included in the layout diagrams of the corresponding anti-fuse cells A1-A4, and some or all of the portions of gate regions P1-P18 overlying corresponding anti-fuse cells A1-A4 are included or not included in the layout diagrams of the corresponding anti-fuse cells A1-A4.

In the embodiment depicted in FIG. 1C, portions of anti-fuse cells A1 and A2 overlapping portions of anti-fuse cells A3 and A4 include two gate regions P9 and P10, and each combination of anti-fuse cells A1 and A3 and anti-fuse cells A2 and A4 includes 18 gate regions P1-P18. In various embodiments, portions of anti-fuse cells A1 and A2 overlapping portions of anti-fuse cells A3 and A4 include fewer or greater than two gate regions. In various embodiments, each combination of anti-fuse cells A1 and A3 and anti-fuse cells A2 and A4 includes fewer or greater than 18 gate regions.

In the embodiment depicted in FIG. 1C, anti-fuse cell array 100 includes four anti-fuse cells A1-A4. In various embodiments, anti-fuse cell array 100 includes fewer or greater than four anti-fuse cells.

As discussed above with respect to FIG. 1A, and also depicted in FIGS. 1C and 1D, an IC device manufactured based on anti-fuse cell A1 includes anti-fuse bits B1 and B5 positioned within active region AA1. Details of anti-fuse bits B1 and B5, e.g., the embodiment depicted in FIG. 1A, are not included in FIGS. 1C and 1D for the purpose of clarity.

In addition to anti-fuse bits B1 and B5, an IC device manufactured based on anti-fuse cell array 100 includes anti-fuse bits B2 and B6 positioned within an active area corresponding to active regions AA2 of anti-fuse cell A1 and AA0 of anti-fuse cell A2, anti-fuse bits B3 and B7 positioned within an active area corresponding to active region AA1 of anti-fuse cell A2, and anti-fuse bits B4 and B8 positioned within an active area corresponding to active regions AA2 of anti-fuse cell A2 and AA0 of an anti-fuse cell (not shown) adjacent to anti-fuse cell A2 in the negative Y direction.

An IC device manufactured based on anti-fuse cell array 100 further includes anti-fuse bits B9 and B13 positioned within an active area corresponding to active region AA1 of anti-fuse cell A3, anti-fuse bits B10 and B14 positioned within an active area corresponding to active regions AA2 of anti-fuse cell A3 and AA0 of anti-fuse cell A4, anti-fuse bits B11 and B15 positioned within an active area corresponding to active region AA1 of anti-fuse cell A4, and anti-fuse bits B12 and B16 positioned within an active area corresponding to active regions AA2 of anti-fuse cell A4 and AA0 of an anti-fuse cell (not shown) adjacent to anti-fuse cell A4 in the negative Y direction.

An IC device manufactured based on anti-fuse cell array 100 thereby includes a column of four anti-fuse bits B1-B4, a column of four anti-fuse bits B5-B8, a column of four anti-fuse bits B9-B12, and a column of four anti-fuse bits B13-B16. In various embodiments, one or more columns of anti-fuse bits based on anti-fuse cell array 100 includes one or more anti-fuse bits (not shown) in addition to four of anti-fuse bits B1-B16 based on one or more anti-fuse cells (not shown) above or below one or more of anti-fuse cells A1-A4 in the Y direction.

An IC device manufactured based on anti-fuse cell array 100 further includes the one or more conductive layer segments corresponding to bit line BL1 electrically connected with anti-fuse bits B1 and B5 through the one or more conductive layer segments corresponding to conductive region C1 of anti-fuse cell A1, discussed above with respect to FIG. 1A, and one or more conductive layer segments corresponding to bit line BL1 electrically connected with anti-fuse bits B9 and B13 through one or more conductive layer segments corresponding to a conductive region C1 of anti-fuse cell A3.

Similarly, an IC device manufactured based on anti-fuse cell array 100 includes one or more conductive layer segments corresponding to bit line BL2 electrically connected with anti-fuse bits B2 and B6 through one or more conductive layer segments corresponding to a conductive region C1 of anti-fuse cells A1 and A2, and with anti-fuse bits B10 and B14 through one or more conductive layer segments corresponding to a conductive region C1 of anti-fuse cells A3 and A4; one or more conductive layer segments corresponding to bit line BL3 electrically connected with anti-fuse bits B3 and B7 through one or more conductive layer segments corresponding to a conductive region C1 of anti-fuse cell A2, and with anti-fuse bits B11 and B15 through one or more conductive layer segments corresponding to a conductive region C1 of anti-fuse cell A4; and one or more conductive layer segments corresponding to bit line BL4 electrically connected with anti-fuse bits B4 and B8 through one or more conductive layer segments corresponding to a conductive region C1 of anti-fuse cell A2, and with anti-fuse bits B12 and B16 through one or more conductive layer segments corresponding to a conductive region C1 of anti-fuse cell A4.

Each anti-fuse cell A1-A4 includes conductive regions Z0 and Z1 separated by distance D1 in the X direction, as discussed above with respect to FIG. 1A. In various embodiments, each instance of distance D1 has a same value, or one or more instances of distance D1 has one or more values different from a value of one or more other instances of distance D1.

Figure 1E:
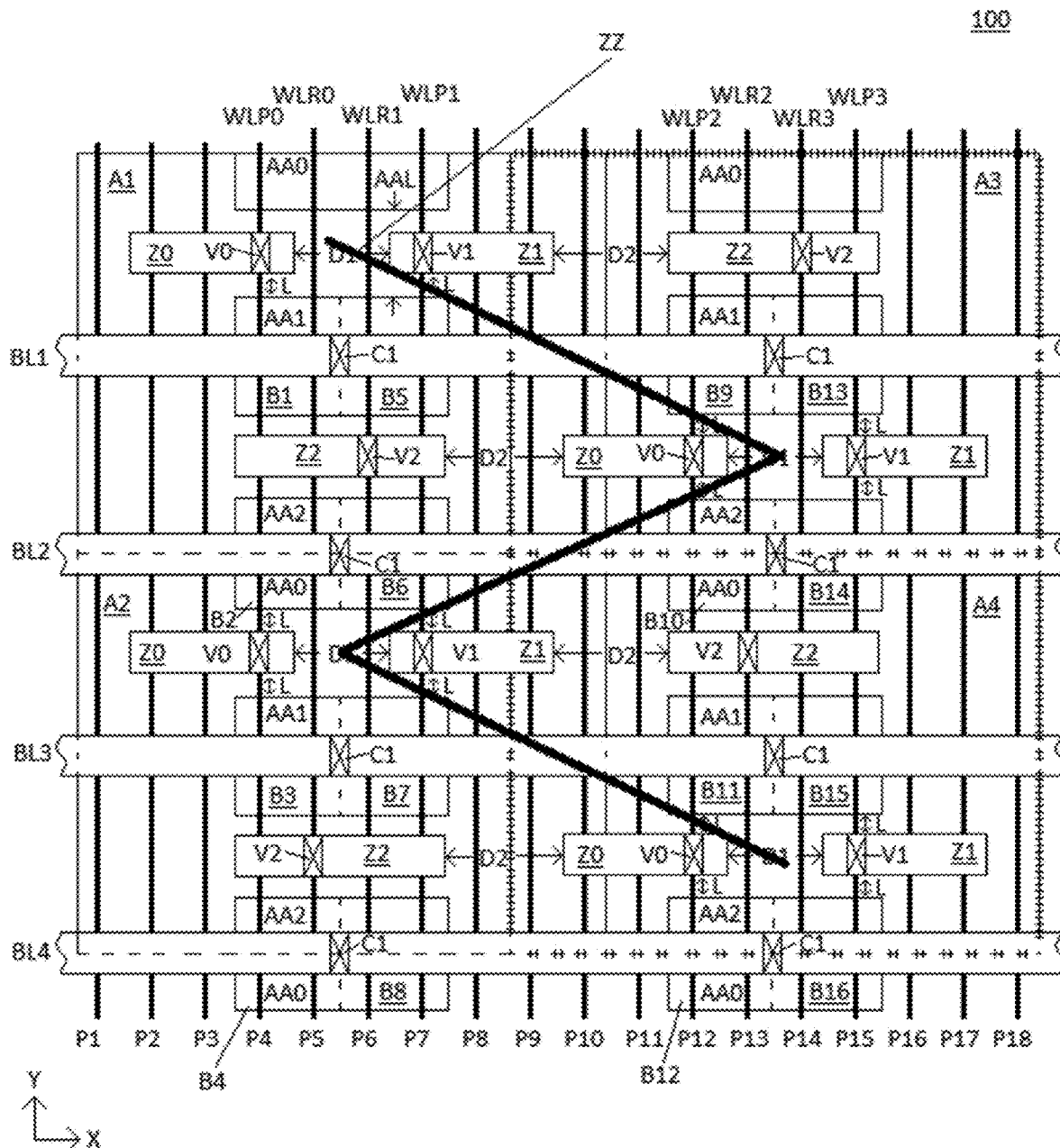

FIG. 1E depicts the embodiment of FIG. 1C, and also includes a zig-zag pattern ZZ formed by the configuration of anti-fuse cells A1-A4 within anti-fuse cell array 100. Pattern ZZ traces the locations at which conductive regions Z0 and Z1 are separated by distance D1 within anti-fuse cells A1-A4.

Conductive regions Z0 and Z1 of anti-fuse cell A1 are aligned with conductive region Z2 of anti-fuse cell A3 along the X direction and separated by a distance D2. Distance D2 has a value equal to or greater than the predetermined distance based on one or more design rules for the conductive layer that includes conductive regions Z0, Z1, and Z2, as discussed above with respect to distance D1 and FIG. 1A.

Conductive region Z2 of anti-fuse cell A1 is aligned with conductive regions Z0 and Z1 of anti-fuse cell A3 along the X direction and separated by distance D2, conductive regions Z0 and Z1 of anti-fuse cell A2 are aligned with conductive region Z2 of anti-fuse cell A4 along the X direction and separated by distance D2, and conductive region Z2 of anti-fuse cell A2 is aligned with conductive regions Z0 and Z1 of anti-fuse cell A4 along the X direction and separated by distance D2. In various embodiments, each instance of distance D2 has a same value, or one or more instances of distance D2 has one or more values different from a value of one or more other instances of distance D2.

As discussed above with respect to FIGS. 1A and 1B, each of the gate structure portions corresponding to gate region P4 and anti-fuse bit B1 and to gate region P7 and anti-fuse bit B5 has length L. By the arrangement of anti-fuse cells A1-A4 in anti-fuse cell array 100, each anti-fuse bit B2-B4 and B6-B16 similarly includes a gate structure portion corresponding to a gate region P4, P7, P12, or P15 between an active area and an adjacent conductive region V0 or V1, each gate structure portion thereby having length L (not shown for anti-fuse bits B4 and B8).

In various embodiments, each instance of length L has a same value based on uniform spacing between active regions and adjacent conductive regions, or one or more instances of length L has a value different from one or more other instances of length L based on variable spacing between one or more active regions and one or more conductive regions. In some embodiments, variable spacing between one or more active regions and one or more conductive regions is based on an offset or other difference between an active region pitch and a conductive region pitch.

As discussed above with respect to FIG. A1, adjacent active regions AA0 and AA1 of anti-fuse cell A1 are separated by distance AAL greater than length L. Anti-fuse cell array 100 includes each additional pair of adjacent active regions separated by distance AAL (not labeled for the purpose of clarity) greater than length L. In various embodiments, each instance of distance AAL has a same value based on uniform spacing between adjacent active regions, or one or more instances of distance AAL has a value different from one or more other instances of distance AAL based on variable spacing between one or more pairs of adjacent active regions.

As depicted in FIG. 1D, each conductive region MWLP0, MWLR0, MWLR1, MWLP1 is a region in the IC layout diagram included in the manufacturing process as part of defining one or more segments of one or more conductive layers in the IC device. In various embodiments, one or more of conductive regions MWLP0, MWLR0, MWLR1, or MWLP1 corresponds to one or more segments of a same or different conductive layers in the IC device. In various embodiments, one or more of conductive regions MWLP0, MWLR0, MWLR1, or MWLP1 corresponds to one or more of a metal one or a higher metal layer in the IC device. In some embodiments, conductive regions MWLP0 and MWLP1 are included in a manufacturing process as part of defining conductive segments 5MWLP0 and 5MWLP1, respectively, discussed below with respect to FIG. 5C.

With respect to anti-fuse bits B1-B8, conductive region MWLP0 extends in the Y direction and overlies each conductive region Z0, conductive region MWLR0 extends in the Y direction and overlies one conductive region Z2, conductive region MWLR1 extends in the Y direction and overlies the other conductive region Z2, and conductive region MWLP1 extends in the Y direction and overlies each conductive region Z1.

Each conductive region VWLP0, VWLR0, VWLR1, and VWLP1 is a region in the IC layout diagram included in the manufacturing process as part of defining one or more segments of one or more conductive layers in the IC device configured to form an electrical connection between one or more conductive layer segments corresponding to one of conductive regions MWLP0, MWLR0, MWLR1, or MWLP1 and one of conductive regions Z0, Z1, or Z2. In various embodiments, the one or more conductive layer segments corresponding to each conductive region VWLP0, VWLR0, VWLR1, and VWLP1 includes a via between one or more metal layer segments corresponding to one of conductive regions Z0, Z1, or Z2 and one or more metal layer segments corresponding to one of conductive regions MWLP0, MWLR0, MWLR1, or MWLP1. In some embodiments, conductive regions VWLP0, VWLP1 are included in a manufacturing process as part of defining respective vias 5VWLP0 and 5VWLP1 discussed below with respect to FIG. 5C.

In some embodiments in which anti-fuse cell array 100 includes anti-fuse bits in addition to anti-fuse bits B1-B8, anti-fuse cell array 100 includes conductive regions (not shown) in addition to conductive regions MWLP0, MWLR0, MWLR1, MWLP1, VWLP0, VWLR0, VWLR1, and VWLP1 that are configured with respect to the additional anti-fuse bits in the manner discussed above with respect to anti-fuse bits B1-B8.

By the configuration of anti-fuse cell array 100 discussed above, each column of anti-fuse bits, e.g., anti-fuse bits B1-B4, is electrically connected to a corresponding conductive segment, e.g., a segment corresponding to conductive region MWLP0, through multiple conductive segments, e.g., segments corresponding to conductive regions V0, Z0, and VWLP0, in which a total of two anti-fuse bits are positioned between adjacent conductive segments of the multiple conductive segments. Accordingly, each read current path corresponding to an anti-fuse bit includes a gate structure portion having length L based on the active area corresponding to the anti-fuse bit being adjacent to a conductive segment of the multiple conductive segments.

In the embodiment depicted in FIGS. 1C and 1D, an IC layout diagram of anti-fuse cell array 100 has the configuration discussed above based on IC layout diagrams of embodiments of anti-fuse cell A1, discussed above with respect to FIG. 1A. In various embodiments, an IC layout of anti-fuse cell array 100 is otherwise based on one or more IC layout diagrams of one or more anti-fuse cells so as to have the configuration in which each read current path corresponding to an anti-fuse bit includes a gate structure portion having length L shorter than distance AAL based on the active area corresponding to the anti-fuse bit being adjacent to a conductive segment of multiple conductive segments.

In programming and read operations, each anti-fuse bit B1-B4 is responsive to signals WLP0 and WLR0 received from conductive segments corresponding to respective conductive regions MWLP0 and MWLR0 on gate structures corresponding to respective gate regions P4 and P5, and each anti-fuse bit B5-B8 is responsive to signals WLR1 and WLP1 received from conductive segments corresponding to respective conductive regions MWLR1 and MWLP1 on gate structures corresponding to respective gate regions P6 and P7.

In programming and read operations, each anti-fuse bit B9-B12 is responsive to signals WLP2 and WLR2 received from conductive segments corresponding to respective conductive regions (not shown) on gate structures corresponding to respective gate regions P12 and P13, and each anti-fuse bit B13-B16 is responsive to signals WLR3 and WLP3 received from conductive segments corresponding to respective conductive regions (not shown) on gate structures corresponding to respective gate regions P14 and P15. Signals WLP2, WLR2, WLP3, and WLR3 are configured to control the corresponding bit cells in the manner discussed above with respect to signals WLP0, WLR0, WLP1, and WLR1 and FIGS. 1A and 1B.

Figure 5A:
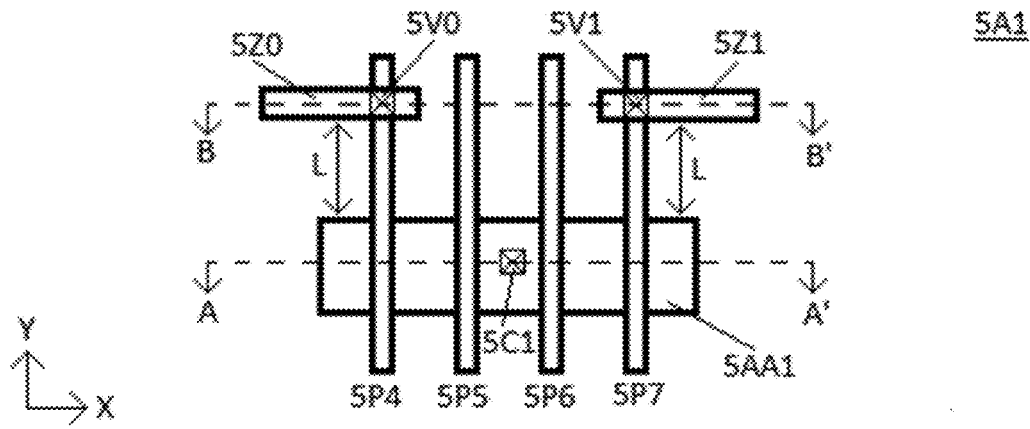
FIGS. 5A-5C are diagrams of an IC device, in accordance with some embodiments.
Figure 5B:
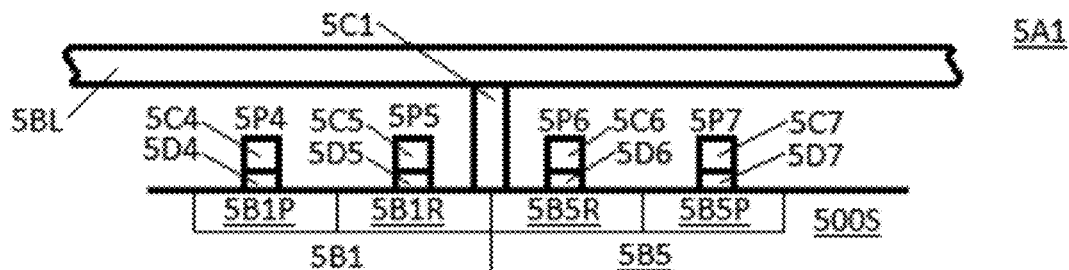
Figure 5C:
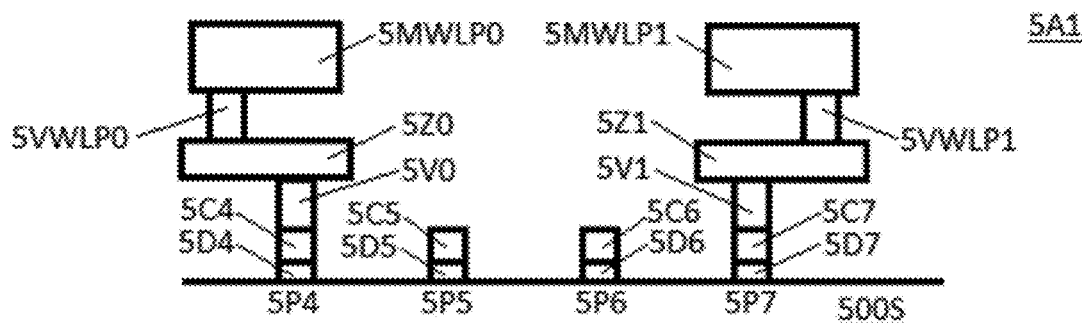

An IC device manufactured based on anti-fuse cell array 100, e.g., IC device 5A1 discussed below with respect to FIGS. 5A-5C, is thereby configured such that each anti-fuse bit B2-B4 and B6-B16 is responsive to a pair of corresponding signals WLP0 and WLR0, WLP1 and WLR1, WLP2 and WLR2, or WLP3 and WLR3, and to a reference voltage level provided on a bit line based on a corresponding bit line BL1-BL4 in programming and read operations in the manner discussed above with respect to anti-fuse bits B1 and B5 and FIGS. 1A and 1B.

Based on the configuration discussed above, the programming and read current paths of anti-fuse bits B1-B16 include gate structure portions that are shorter than the distance between adjacent active areas, and thereby less resistive, than programming and read current paths in arrays based on approaches in which gate structure portions overlie one or more active regions in addition to an active region including the corresponding anti-fuse bit. Anti-fuse cell array 100 thereby realizes the benefits discussed above with respect to anti-fuse cell A1.

Because each gate structure portion of the programming and read current path of anti-fuse bits B1-B16 has length L based on a conductive region adjacent to an active area, programming and read current path resistance values within anti-fuse cell array 100 are more uniform than programming and read current path resistance values in arrays in which a subset of gate structure portions overlie one or more active regions in addition to active regions including the corresponding anti-fuse bits.

As discussed below with respect to FIGS. 1F-1H, the increased uniformity results in less variability in read current values compared to approaches in which a subset of gate structure portions overlie one or more active regions in addition to active regions including the corresponding anti-fuse bits.

FIG. 1F is a schematic diagram of a portion of anti-fuse cell array 100 corresponding to anti-fuse bits B1-B8, in accordance with some embodiments. FIG. 1F includes signals WLP0, WLR0, WLR1, and WLP1, resistors RP0 and RP1, bit line BL1, gate regions P4-P7, and anti-fuse bits B1 and B5, each discussed above with respect to FIGS. 1A and 1B, and bit lines BL2-BL4 and anti-fuse bits B2-B4 and B6-B8, each discussed above with respect to FIGS. 1C-1E.

FIG. 1F also includes resistors RR0, RR1, and RBL1-RBL4. Resistor RR0 represents the gate structure portion corresponding to gate region P5 between a given one of anti-fuse bits B1-B4 and a nearest conductive region V2, resistor RR1 represents the gate structure portion corresponding to gate region P6 between a given one of anti-fuse bits B5-B8 and a nearest conductive region V2, and each resistor RBL1-RBL4 represents one or more conductive segments corresponding to a respective one of bit lines BL1-BL4.

As discussed above with respect to FIGS. 1A and 1B, resistor RP0 represents the length of the gate structure portion corresponding to gate region P4 between anti-fuse bit B1 and a nearest conductive region V0, and resistor RP1 represents the length of the gate structure portion corresponding to gate region P7 between anti-fuse bit B5 and a nearest conductive region V1. In the embodiment depicted in FIGS. 1F-1H, each gate structure portion corresponding to gate region P4 between anti-fuse bits B1-B4 and a nearest conductive region V0 has a same length such that resistor RP0 has a same value for each anti-fuse bit B1-B4, and each gate structure portion corresponding to gate region P7 between anti-fuse bits B5-B8 and a nearest conductive region V1 has a same length such that resistor RP1 has a same value for each anti-fuse bit B1-B4.

Based on the layout of anti-fuse cell array 100, in at least some cases, a length of a gate structure portion between a given one of anti-fuse bits B1-B8 and a nearest conductive region V2 is different from one or more lengths of structure portions between another one or more of anti-fuse bits B1-B8 and a nearest conductive region V2. In such cases, corresponding resistors RR0 and/or RR1 have nominal values that differ based on the differing lengths.

In some embodiments, in at least some cases, a length of a gate structure portion between a given one or more of anti-fuse bits B1-B8 and a nearest conductive region V2 is the same as a length of one or more gate structure portions between another one or more of anti-fuse bits B1-B8 and a nearest conductive region V2. In such cases, corresponding resistors RR0 and/or RR1 have a same nominal value based on the same lengths.

Resistors RBL1-RBL4 have values that vary based on the dimensions of the one or more conductive segments corresponding to the respective bit lines BL1-BL4, the dimensions including bit line lengths that vary based on a position of a given anti-fuse bit along a given bit line. In the embodiment depicted in FIGS. 1F-1H, a resistivity of the one or more conductive segments is sufficiently small that such variations are not significant, and each resistor RBL1-RBL4 is considered to have a same nominal value.

FIG. 1G is a schematic diagram of a portion of anti-fuse cell array 100 corresponding to anti-fuse bits B1-B4, in accordance with some embodiments. In addition to a subset of the features depicted in FIG. 1F, FIG. 1G includes resistors RVZ and 2RPO.

Each resistor RVZ represents a conductive path corresponding to an instance of conductive region VWLP0, an instance of conductive region V0, and a portion of the conductive segment corresponding to conductive region Z0 connecting the instances of conductive regions VWLP0 and V0. Based on the instances of conductive regions VWLP0, V0, and Z0 having similar layouts, resistors RVZ have a same nominal value.

Each resistor 2RPO represents a portion of the gate structure corresponding to gate region P4 between adjacent anti-fuse bits and free from an electrical connection corresponding to a conductive region V0. Because the gate structure corresponding to gate region P4 includes two portions corresponding to a resistor RP0 for each portion corresponding to a resistor 2RP0, resistors 2RP0 have values significantly larger than those of resistors RP0. In some embodiments, a resistor 2RP0 has a nominal value approximately double that of a resistor RP0.

As discussed above with respect to FIGS. 1A and 1B, in a read operation on anti-fuse bit B1, signal WLP0 causes current IBL to flow through anti-fuse bit B1 and bit line BL1, and the value of current IBL is used to determine the programmed status of anti-fuse bit B1. As depicted in FIGS. 1F and 1G, in addition to anti-fuse bit B1 itself, the read current path for anti-fuse bit B1 includes resistors RVZ, RP0, and RBL1.

Similarly, for each anti-fuse bit B2-B4, the read current path includes the corresponding anti-fuse bit, one of resistors RBL2-RBL4 corresponding to a respective bit line BL2-BL4, and resistors RVZ and RP0. Based on the layout of anti-fuse cell array 100, the read current path for each anti-fuse bit B1-B4 does not include resistor 2RP0.

As discussed above, in the embodiment depicted in FIGS. 1F-1H, resistors RBL1-RBL4, RVZ, and RP0 have respective nominal values that are the same for each anti-fuse bit B1-B4. Accordingly, in read operations on anti-fuse bits B1-B4, read currents have values that are more uniform than in approaches in which resistor RP0 has nominal values that vary among anti-fuse bits, for example by including a resistor such as resistor 2RP0 in a subset of the read current paths.

FIG. 1H is a schematic diagram of a portion of anti-fuse cell array 100 corresponding to a generic representation of an anti-fuse bit Bn, in accordance with some embodiments. Anti-fuse bit Bn corresponds to one of anti-fuse bits B1-B16, discussed above with respect to FIGS. 1A-1E, and includes a transistor BnR and a resistor RBn. Transistor BnR corresponds to transistor B1R or B5R, and resistor RBn represents a low resistance programmed status of anti-fuse bit Bn corresponding to resistor RB1 or RB5, discussed above with respect to FIGS. 1A and 1B.

Anti-fuse bit Bn is electrically connected with a bit line BLn corresponding to a bit line BL1-BL4, and has a read current path that includes resistors RVZ, RPn corresponding to resistor RP0 or RP1, and RBLn corresponding to a respective resistor RBL1-RBL4.

In a read operation on anti-fuse bit Bn, a signal WLPn, corresponding to a signal WLP0 or WLP1, causes a read current IBLn to flow based on the values of resistances RVZ, RPn, RBn, and RBLn. In the embodiment depicted in FIGS. 1F-1H, because the respective nominal values of resistances RVZ, RPn, and RBLn are uniform throughout anti-fuse cell array 100, a distribution of read current values IBLn has a narrower grouping than read current distributions in approaches in which resistor RPn has nominal values that vary among anti-fuse bits Bn, for example by including a resistor such as resistor 2RP0 in a subset of the read current paths.

In the read operation on anti-fuse bit Bn, a signal WLRn, corresponding to a signal WLR0 or WLR1, is received by transistor BnR through a resistor RRn, corresponding to resistor RR0 or RR1, thereby causing transistor BnR to turn on and enabling read current IBLn to flow. Because the read current path of anti-fuse bit Bn does not include resistor RRn, variations in values of resistor RRn among instances of anti-fuse bit Bn in anti-fuse cell array 100 do not affect the uniformity of read current IBLn values.

Figure 2:
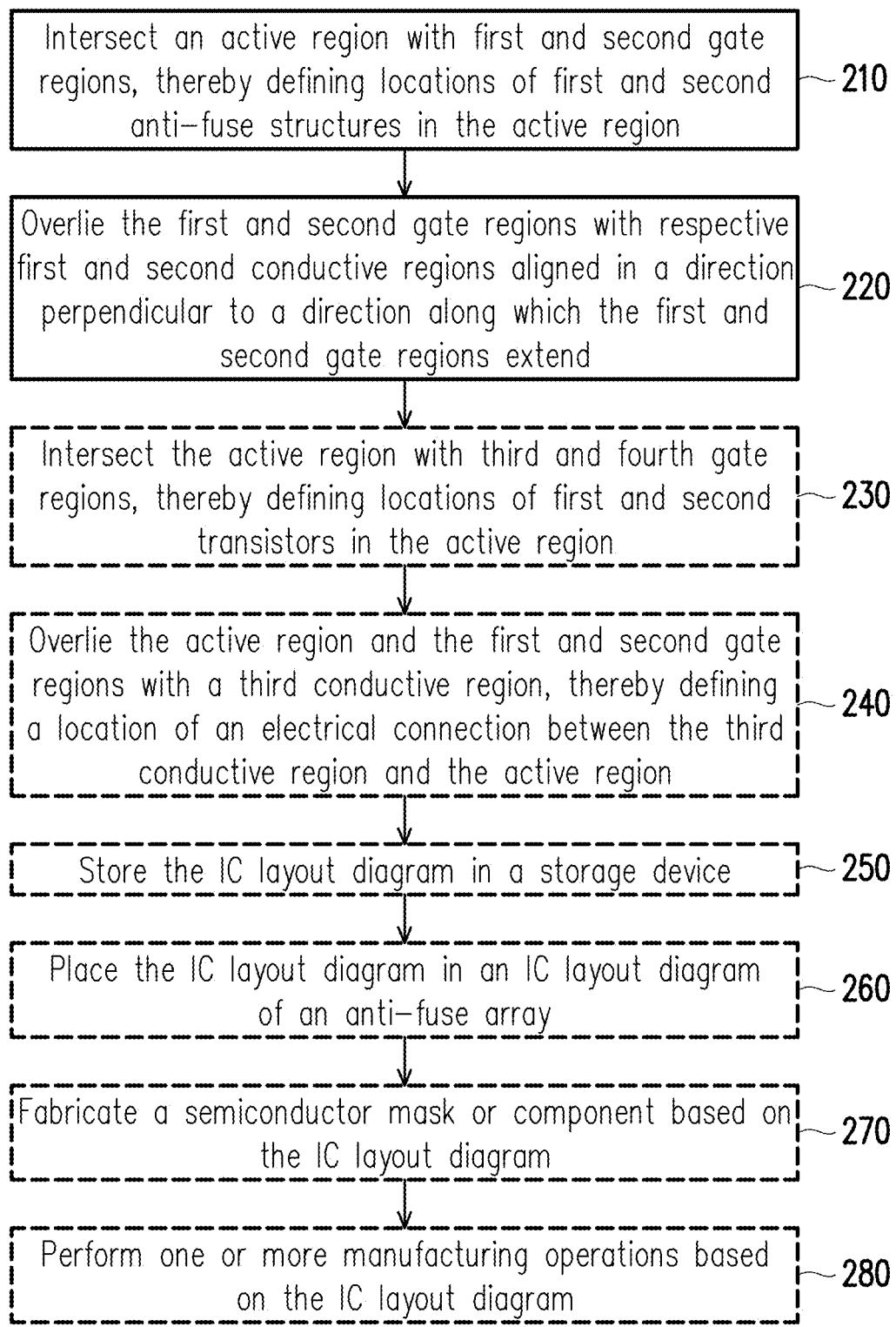
FIG. 2 is a flowchart of a method of generating an IC layout diagram, in accordance with some embodiments.

FIG. 2 is a flowchart of a method 200 of generating an IC layout diagram, in accordance with some embodiments. In some embodiments, generating the IC layout diagram includes generating an IC layout diagram of an anti-fuse cell, e.g., anti-fuse cell A1 discussed above with respect to FIGS. 1A-1D.

The operations of method 200 are capable of being performed as part of a method of forming one or more IC devices including one or more anti-fuse structures, e.g., IC device 5A1 discussed below with respect to FIGS. 5A-5C, manufactured based on the generated IC layout diagram. Non-limiting examples of IC devices include memory circuits, logic devices, processing devices, signal processing circuits, and the like.

In some embodiments, some or all of method 200 is executed by a processor of a computer. In some embodiments, some or all of method 200 is executed by a processor 702 of EDA system 700, discussed below with respect to FIG. 7.

Some or all of the operations of method 200 are capable of being performed as part of a design procedure performed in a design house, e.g., design house 820 discussed below with respect to FIG. 8.

In some embodiments, the operations of method 200 are performed in the order depicted in FIG. 2. In some embodiments, the operations of method 200 are performed in an order other than the order depicted in FIG. 2. In some embodiments, one or more operations are performed before, between, during, and/or after performing one or more operations of method 200.

At operation 210, an active region is intersected with first and second gate regions, thereby defining locations of first and second anti-fuse structures in the active region. Intersecting the active region with the first and second gate regions includes extending each of the first and second gate regions to an area outside the active region along a direction perpendicular to a direction along which the active region extends.

In some embodiments, intersecting the active region with the first and second gate regions is part of intersecting the active region with a plurality of gate regions that includes one or more gate regions in addition to the first and second gate regions. In some embodiments, the one or more additional gate regions include one or more dummy gate regions.

Defining the locations of the first and second anti-fuse structures in the active region includes defining a rectangle or other area usable in a manufacturing process for positioning one or more dielectric layers capable of being sustainably altered by a sufficiently strong electric field.

In some embodiments, intersecting the active region with the first and second gate regions includes intersecting active region AA1 with gate regions P4 and P7, discussed above with respect to FIGS. 1A-1D.

At operation 220, the first and second gate regions are overlaid with respective first and second conductive regions aligned in the direction perpendicular to the direction along which the first and second gate regions extend. Overlying the first gate region with a first conductive region defines a location of an electrical connection between the first conductive region and the first gate region, and overlying the second gate region with a second conductive region defines a location of an electrical connection between the second conductive region and the second gate region.

Defining each of the locations of the electrical connections between the first and second conductive regions and the respective first and second gate regions includes defining a distance from the active area to the electrical connections less than a distance from the active area to an adjacent active area.

Defining the locations of the electrical connections includes defining a rectangle or other area usable in a manufacturing process for positioning one or more conductive segments capable of forming an electrical connection from an overlying conductive segment to a gate structure corresponding to the underlying gate region. In some embodiments, overlying the first and second conductive regions defines locations of vias between corresponding gate structures and segments in an overlying metal layer. In some embodiments, overlying the first and second conductive regions is part of defining segments of a metal zero layer.

In some embodiments, overlying the first and second conductive regions includes separating the first and second conductive regions by a space equal to or greater than a predetermined distance based on one or more design rules for the conductive layer that includes the first and second conductive regions. In some embodiments, overlying the first and second conductive regions includes separating the first and second conductive regions by a space equal to or greater than minimum spacing rule of a metal zero layer.

In some embodiments, overlying the first and second gate regions with the respective first and second conductive regions includes overlying gate regions P4 and P7 with respective conductive regions Z0 and Z1, discussed above with respect to FIGS. 1A-1D.

At operation 230, in some embodiments, the active region is intersected with third and fourth gate regions parallel to the first and second gate regions. Intersecting the active region with the third and fourth gate regions includes defining locations of first and second transistors in the active region.

Defining the locations of the first and second transistors in the active region includes defining a rectangle or other area usable in a manufacturing process for positioning one or more dielectric layers capable of controlling a channel in the active area corresponding to the active region. Defining the location of the first transistor includes the first transistor being adjacent to the first anti-fuse structure, and defining the location of the second transistor includes the second transistor being adjacent to the second anti-fuse structure.

In various embodiments, intersecting the active region with the third and fourth gate regions includes positioning one or both of the first or second gate region inside or outside one or both of the third or fourth gate regions. In some embodiments, intersecting the active region with the third and fourth gate regions includes positioning the space between the first and second conductive regions to include the third and fourth gate regions.

In some embodiments, intersecting the active region with the third and fourth gate regions includes intersecting active region AA1 with gate regions P5 and P6, discussed above with respect to FIGS. 1A-1D.

At operation 240, in some embodiments, the active region and the first and second gate regions are overlaid with a third conductive region extending along the direction along which the active region extends. In some embodiments, overlying the active region and the first and second gate regions with the third conductive region includes defining one or more conductive segments in a metal zero layer.

In some embodiments, overlying the active region with the third conductive region includes defining a location of an electrical connection between the third conductive region and the active region. Defining the location of the electrical connection includes defining a rectangle or other area usable in a manufacturing process for positioning one or more conductive segments capable of forming an electrical connection from an overlying conductive segment to the active area corresponding to the active region. In some embodiments, overlying the active region defines the locations of a contact structure between the active area and one or more segments in an overlying metal layer. In some embodiments, defining the location of the electrical connection includes defining the location between the third and fourth gate regions.

In some embodiments, overlying the active region and the first and second gate regions with the third conductive region includes overlying active region AA1 and gate regions P4 and P7 with bit line BL1, discussed above with respect to FIGS. 1A-1C. In some embodiments, overlying the active region with the third conductive region includes defining the location of one or more conductive segments corresponding to conductive region C1, discussed above with respect to FIGS. 1A-1C.

At operation 250, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 260, in some embodiments, the IC layout diagram is placed in an IC layout diagram of an anti-fuse array. In some embodiments, placing the IC layout diagram in the IC layout diagram of the anti-fuse array includes rotating the IC layout diagram about one or more axes or shifting the IC layout diagram relative to one or more additional IC layout diagrams in one or more directions.

At operation 270, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 280, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 200, an IC layout diagram is generated in which gate regions corresponding to read current paths have the properties, and thereby the benefits, discussed above with respect to anti-fuse cell A1 and anti-fuse cell array 100.

Figures 3A, 3B, 3C, 3D:
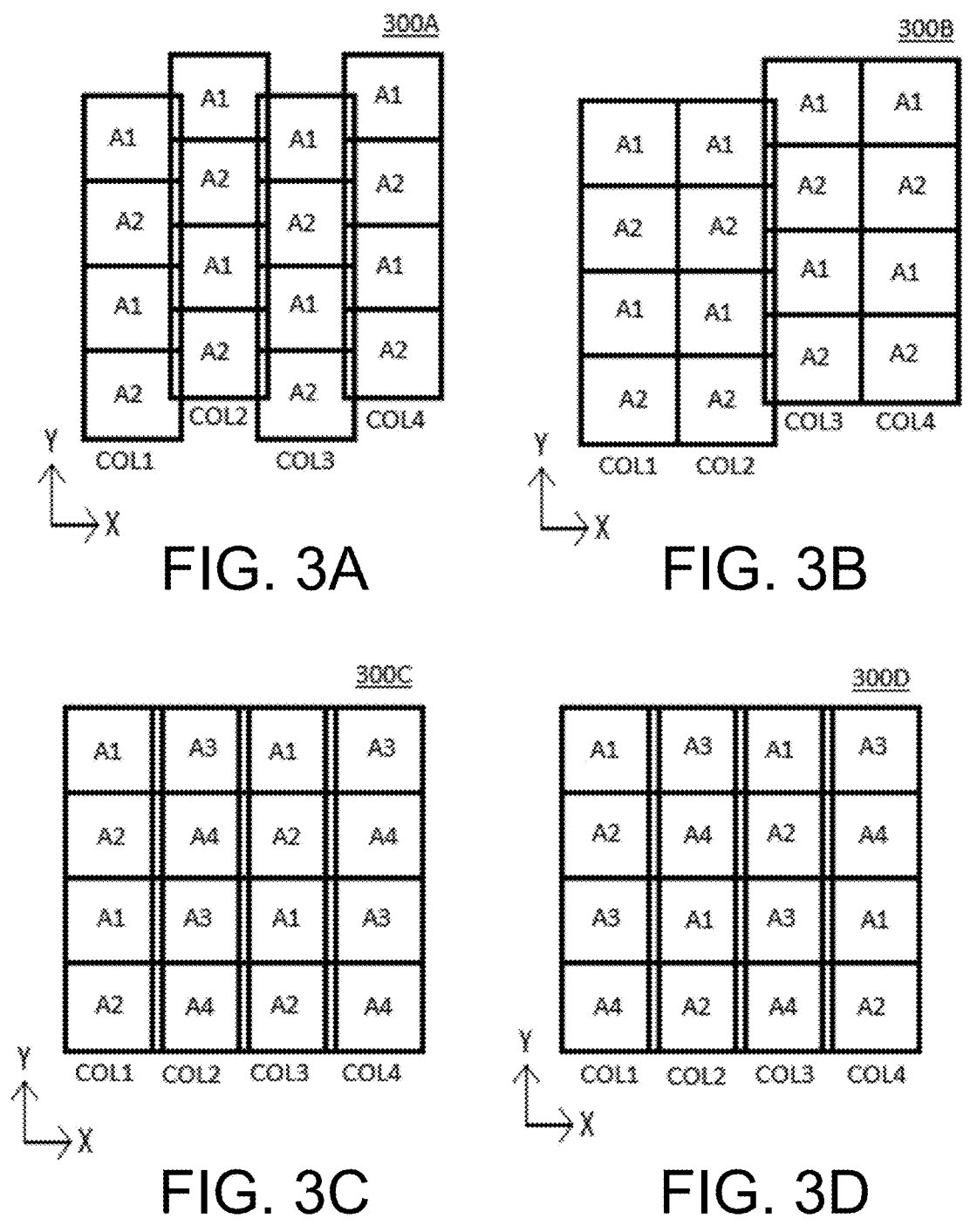

FIGS. 3A-3D are diagrams of respective anti-fuse arrays 300A-300D, in accordance with some embodiments. Each of FIGS. 3A-3D depicts a plan view of an IC layout diagram of an arrangement of multiple embodiments of anti-fuse array cell A1, simplified for the purpose of clarity, and discussed above with respect to FIGS. 1A-1C. FIG. 3A depicts anti-fuse array 300A including anti-fuse cells A1 and A2, FIG. 3B depicts anti-fuse array 300B including anti-fuse cells A1 and A2, FIG. 3C depicts anti-fuse array 300C including anti-fuse cells A1-A4, and FIG. 3D depicts anti-fuse array 300D including anti-fuse cells A1-A4.

In the embodiments depicted in FIGS. 3A-3D, each respective anti-fuse array 300A-300D includes four adjacent columns COL1-COL4, each column including four anti-fuse cells. In various embodiments, an anti-fuse array 300A-300D includes greater or fewer than four adjacent columns and/or each column includes greater or fewer than four anti-fuse cells.

In anti-fuse arrays 300A and 300B, each column COL1-COL4 includes anti-fuse cells A1 and A2 alternating along the Y direction. In anti-fuse array 300A, columns COL1 and COL3 include a first subset of anti-fuse cells A1 and A2, and columns COL2 and COL4 include a second subset of anti-fuse cells A1 and A2. Columns COL2 and COL4 including the second subset are shifted along the Y direction relative to columns COL1 and COL3 including the first subset.

In anti-fuse array 300B, columns COL1 and COL2 include a first subset of anti-fuse cells A1 and A2, and columns COL3 and COL4 include a second subset of anti-fuse cells A1 and A2. Columns COL3 and COL4 including the second subset are shifted along the Y direction relative to columns COL1 and COL2 including the first subset.

The second subset being shifted relative to the first subset includes an anti-fuse structure location of the first subset being aligned with an anti-fuse structure location of the second subset, and an electrical connection location of the first subset being aligned with a midpoint between two adjacent electrical connection locations of the second subset along the X direction.

In anti-fuse arrays 300A and 300B, columns overlap at each location at which a column including the first subset is adjacent to a column including the second subset. At the overlap locations, the combination of the overlapping columns and the second subset being shifted relative to the first subset results in each of anti-fuse arrays 300A and 300B including the layout configuration of anti-fuse cell array 100, discussed above with respect to FIG. 1C.

In various embodiments, one or both of anti-fuse arrays 300A or 300B is part of a larger array that includes configurations other than those depicted in FIGS. 3A and 3B. Non-limiting examples include arrays in which one or both subsets include more than two adjacent columns and/or a variety of numbers of adjacent columns.

Anti-fuse arrays 300C and 300D include anti-fuse cells A1-A4 arranged in rows in addition to being arranged in columns. Each row either anti-fuse cells A1 and A3 alternating along the X direction, or anti-fuse cells A2 and A4 alternating along the X direction.

In anti-fuse array 300C, each of columns COL1 and COL3 includes anti-fuse cells A1 and A2 alternating along the Y direction, and each of columns COL2 and COL4 includes anti-fuse cells A3 and A4 alternating in the Y direction. In anti-fuse array 300D, each of columns COL1 and COL3 includes anti-fuse cells A1-A4 arranged from A1 to A4 along the negative Y direction, and each of columns COL2 and COL4 includes the arrangement of columns COL1 and COL3 shifted by two cells along the Y direction.

In anti-fuse arrays 300C and 300D, each column overlaps with each adjacent column. Each grouping of anti-fuse cells A1-A4 thereby includes the layout configuration of anti-fuse cell array 100, discussed above with respect to FIG. 1C.

In various embodiments, one or both of anti-fuse arrays 300C or 300D is part of a larger array that includes configurations other than those depicted in FIGS. 3C and 3D. Non-limiting examples include arrays in which parts or all of one or both of the configurations depicted in FIGS. 3C and 3D are combined.

By including the configuration of anti-fuse cell array 100, IC layout diagrams of anti-fuse arrays 300A-300D, and IC devices manufactured based thereon, are capable of realizing the benefits discussed above with respect to anti-fuse cell A1 and anti-fuse cell array 100.

Figure 4:
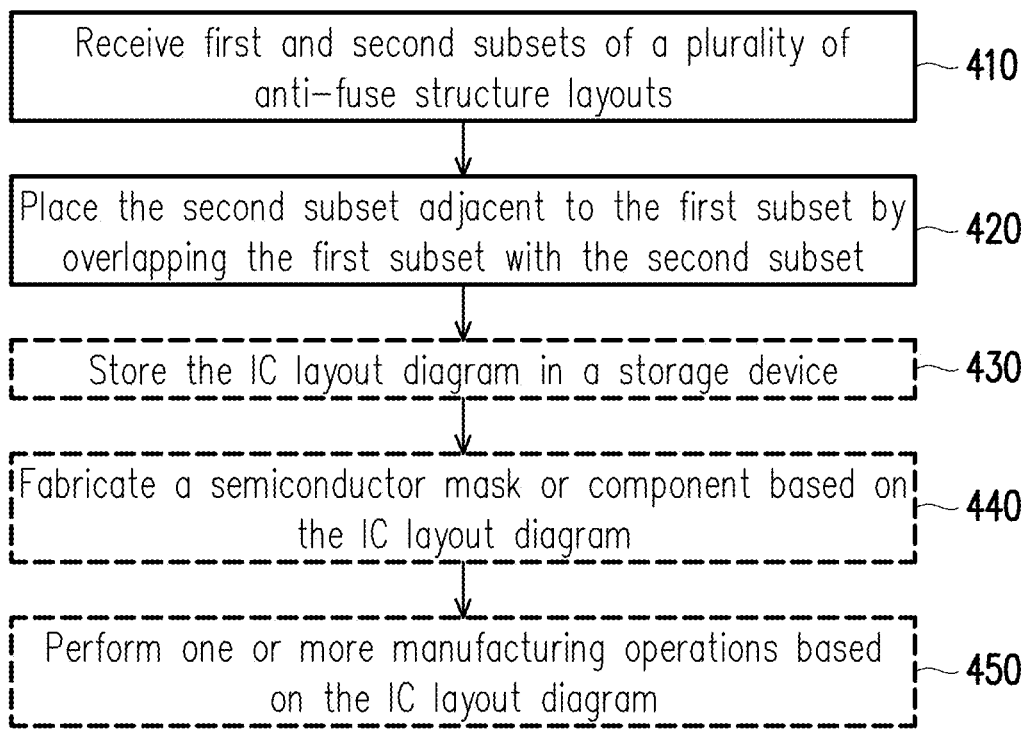
FIG. 4 is a flowchart of a method of generating an IC layout diagram, in accordance with some embodiments.

FIG. 4 is a flowchart of a method 400 of generating an IC layout diagram, in accordance with some embodiments. In some embodiments, generating the IC layout diagram includes generating an IC layout diagram of an anti-fuse cell array, e.g., anti-fuse cell array 100, discussed above with respect to FIGS. 1C and 1D.

The operations of method 400 are capable of being performed as part of a method of forming one or more IC devices including one or more anti-fuse structures, e.g., IC device 5A1 discussed below with respect to FIGS. 5A-5C, manufactured based on the generated IC layout diagram. Non-limiting examples of IC devices include memory circuits, logic devices, processing devices, signal processing circuits, and the like.

In some embodiments, some or all of method 400 is executed by a processor of a computer. In some embodiments, some or all of method 400 is executed by a processor 702 of EDA system 700, discussed below with respect to FIG. 7.

Some or all of the operations of method 400 are capable of being performed as part of a design procedure performed in a design house, e.g., design house 820 discussed below with respect to FIG. 8.

In some embodiments, the operations of method 400 are performed in the order depicted in FIG. 4. In some embodiments, the operations of method 400 are performed in an order other than the order depicted in FIG. 4. In some embodiments, one or more operations are performed before, between, during, and/or after performing one or more operations of method 400.

At operation 410, a first subset of a plurality of anti-fuse structure layouts and a second subset of the plurality of anti-fuse structure layouts are received, each of the first and second subsets extending in a first direction. In various embodiments, one or both of receiving the first or second subsets includes receiving one or more anti-fuse cell layout diagrams. In various embodiments, one or both of receiving the first or second subsets includes receiving one or more IC layout diagrams of one or more of anti-fuse cells A1-A4, discussed above with respect to FIGS. 1A-1D.

In some embodiments, each of the first subset and the second subset includes a plurality of layout regions between the anti-fuse structure layouts of the plurality of anti-fuse structure layouts, the plurality of layout regions alternating between first layout regions and second layout regions. Each of the first layout regions includes a first conductive region extending along the second direction and a second conductive region extending along the second direction and aligned with the first conductive region along the second direction, and each of the second layout regions includes a third conductive region extending along the second direction. In some embodiments, the first layout region includes conductive regions Z0 and Z1, and the second layout region includes conductive region Z2, discussed above with respect to FIGS. 1A-1D.

In some embodiments, receiving the second subset includes receiving a configuration of the second subset corresponding to a configuration of the first subset rotated 180 degrees about an axis extending along the first direction. In some embodiments, receiving the second subset includes receiving the configuration of one or both of anti-fuse cells A2 or A4 corresponding to the configuration of one or both of anti-fuse cells A1 or A3 rotated 180 degrees about an axis extending along the Y direction, as discussed above with respect to FIGS. 1A-1D.

In some embodiments, receiving each of the first and second subsets includes each of the first and second subsets including a plurality of anti-fuse structure locations at intersections of a gate region and a plurality of active regions, the gate region extending in the first direction, and a plurality of electrical connection locations at intersections of the gate region and a plurality of overlying conductive regions. A total of two anti-fuse structure locations of the plurality of anti-fuse structure locations are positioned between each pair of adjacent electrical connection locations of the plurality of electrical connection locations.

In some embodiments, receiving the first subset includes receiving one or more layouts corresponding to anti-fuse bits B1-B8, and receiving the second subset includes receiving one or more layouts corresponding to anti-fuse bits B9-B16, each discussed above with respect to FIGS. 1A-1D.

In some embodiments, the first subset is one first subset of a plurality of first subsets, and receiving the first subset includes receiving the plurality of first subsets. In some embodiments, the second subset is one second subset of a plurality of second subsets, and receiving the second subset includes receiving the plurality of second subsets. In some embodiments, receiving the plurality of first subsets includes receiving columns COL1 and COL3 or columns COL1 and COL2, and receiving the plurality of second subsets includes receiving columns COL2 and COL4 or columns COL3 and COL4, discussed above with respect to FIGS. 3A-3D.

At operation 420, the second subset is placed adjacent to the first subset along a second direction perpendicular to the first direction by overlapping the first subset with the second subset. Overlapping the first subset with the second subset includes one or more layout features being included in both of the first and second subsets.

In some embodiments, overlapping the first subset with the second subset includes both of the first and second subsets including one or more gate regions and/or one or more conductive regions in common. In various embodiments, overlapping the first subset with the second subset includes at least one of each of anti-fuse cells A1-A4 including gate regions P9 and P10, both of anti-fuse cells A1 and A3 including a conductive region Z0 and a conductive region Z1, or both of anti-fuse cells A2 and A4 including a conductive region Z0 and a conductive region Z1, as discussed above with respect to FIGS. 1C and 1D.

In some embodiments, placing the second subset adjacent to the first subset includes shifting the second subset with respect to the first subset along the first direction. In some embodiments, shifting the second subset with respect to the first subset includes aligning the first layout regions of the first subset with the second layout regions of the second subset along the second direction, and aligning the second layout regions of the first subset with the first layout regions of the second subset along the second direction. In some embodiments, shifting the second subset with respect to the first subset includes aligning conductive regions Z0 and Z1 of the first subset with conductive regions Z2 of the second subset.

In some embodiments, shifting the second subset with respect to the first subset includes shifting one or more of columns COL1-COL4 with respect to another one or more of columns COL1-COL4 along the Y direction, discussed above with respect to FIGS. 3A and 3B.

In some embodiments, placing the second subset adjacent to the first subset includes rotating the second subset 180 degrees about an axis extending along the first direction. In some embodiments, placing the second subset adjacent to the first subset includes rotating one or both of anti-fuse cells A1 or A2 180 degrees about an axis extending along the Y direction, thereby obtaining the configuration of corresponding one or both of anti-fuse cells A3 or A4.

In some embodiments, placing the second subset adjacent to the first subset includes placing the second subset having a configuration corresponding to a configuration of the first subset rotated 180 degrees about an axis extending along the first direction. In some embodiments, placing the second subset adjacent to the first subset includes placing anti-fuse cells A3 and A4 adjacent to respective anti-fuse cells A1 and A2, discussed above with respect to FIG. 1C. In some embodiments, placing the second subset adjacent to the first subset includes placing one or more of columns COL1-COL4 adjacent to another one or more of columns COL1-COL4, discussed above with respect to FIGS. 3C and 3D.

In some embodiments in which the first subset is one first subset of a plurality of first subsets, the second subset is one second subset of a plurality of second subsets, placing the second subset adjacent to the first subset along the second direction includes placing each second subset of the plurality of second subsets adjacent to and overlapping a corresponding first subset of the plurality of first subsets along the second direction. In some embodiments, placing the second subset adjacent to the first subset includes placing two or more of columns COL1-COL4 adjacent to another two or more of columns COL1-COL4, discussed above with respect to FIGS. 3A-3D.

At operation 430, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 440, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 450, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 400, an IC layout diagram is generated in which gate regions corresponding to read current paths have the properties, and thereby the benefits, discussed above with respect to anti-fuse cell A1 and anti-fuse cell array 100.

FIGS. 5A-5C are diagrams of IC device 5A1, in accordance with some embodiments. IC device 5A1 is formed by executing some or all of the operations of methods 200 and/or 400 and is configured based on IC layout diagrams A1 and 100, discussed above with respect to FIGS. 1A-1D. In some embodiments, IC device 5A1 is included in an IC device 860 manufactured by an IC manufacturer/fabricator ("fab") 850, discussed below with respect to FIG. 8.

The depictions of IC device 5A1 in FIGS. 5A-5C are simplified for the purpose of clarity. FIG. 5A depicts a plan view of IC device 5A1, FIG. 5B depicts a cross-sectional view along a plane A-A', and FIG. 5C depicts a cross-sectional view along a plane B-B'. FIG. 5A further depicts the X and Y directions, discussed above with respect to FIG. 1A.

IC device 5A1 includes an active area 5AA1 in a substrate 500S extending along the X direction, and gate structures 5P4-5P7, each of which extends along the Y direction and overlies active area 5AA1. Active area 5AA1 is an N-type or P-type active area configured in accordance with active region AA1, and gate structures 5P4-5P7 are gate structures configured in accordance with respective gate regions P4-P7, each of which is discussed above with respect to FIGS. 1A-1D.

Gate structure 5P4 includes a gate conductor 5C4 overlying a dielectric layer 5D4, gate structure 5P5 includes a gate conductor 5C5 overlying a dielectric layer 5D5, gate structure 5P6 includes a gate conductor 5C6 overlying a dielectric layer 5D6, and gate structure 5P7 includes a gate conductor 5C7 overlying a dielectric layer 5D7.

An anti-fuse structure 5B 1P includes the portion of gate structure 5P4 overlying active area 5AA1 and the portions of active area 5AA1 adjacent to gate structure 5P4. A transistor 5B1R includes the portion of gate structure 5P5 overlying active area 5AA1 and the portions of active area 5AA1 adjacent to gate structure 5P5. An anti-fuse bit 5B1 includes anti-fuse structure 5B1P and transistor 5B1R.

An anti-fuse structure 5B5P includes the portion of gate structure 5P7 overlying active area 5AA1 and the portions of active area 5AA1 adjacent to gate structure 5P7. A transistor 5B5R includes the portion of gate structure 5P6 overlying active area 5AA1 and the portions of active area 5AA1 adjacent to gate structure 5P6. An anti-fuse bit 5B5 includes anti-fuse structure 5B5P and transistor 5B5R.

A contact 5C1 is electrically connected to active area 5AA1 between gate structures 5P5 and 5P6, and is configured in accordance with conductive region C1, discussed above with respect to FIGS. 1A-1D. A conductive segment 5BL is electrically connected to the contact 5C1, and is configured in accordance with conductive region BL1, discussed above with respect to FIGS. 1A-1D. In some embodiments, conductive segment 5BL includes a segment of a metal zero layer.

A via 5V0 is electrically connected to gate conductor 5C4, and a via 5V1 is electrically connected to gate conductor 5C7. A distance between active area 5AA1 and each of vias 5V0 and 5V1 corresponds to length L, discussed above with respect to FIGS. 1A-1D. Via 5V0 is configured in accordance with conductive region V0 and via 5V1 is configured in accordance with conductive region V1, each of which is discussed above with respect to FIGS. 1A-1D.

A conductive segment 5Z0 overlies via 5V0, is electrically connected to via 5V0, and is configured in accordance with conductive region Z0, discussed above with respect to FIGS. 1A-1D. A conductive segment 5Z1 overlies via 5V1, is electrically connected to via 5V1, and is configured in accordance with conductive region Z1, discussed above with respect to FIGS. 1A-1D.

Conductive segments 5Z0 and 5Z1 are aligned with each other and along the X direction. In some embodiments, each of conductive segments 5Z0 and 5Z1 includes a segment of a metal zero layer.

A via 5VWLP0 is electrically connected to conductive segment 5Z0, and a via 5VWLP1 is electrically connected to conductive segment 5Z1. Via 5VWLP0 is configured in accordance with conductive region VWLP0 and via 5VWLP1 is configured in accordance with conductive region VWLP1, each of which is discussed above with respect to FIG. 1D.

A conductive segment 5MWLP0 overlies via 5VWLP0, is electrically connected to via 5VWLP0, and is configured in accordance with conductive region MWLP0, discussed above with respect to FIG. 1D. A conductive segment 5MWLP1 overlies via 5VWLP1, is electrically connected to via 5VWLP1, and is configured in accordance with conductive region MWLP1, discussed above with respect to FIG. 1D. In some embodiments, each of conductive segments 5MWLP0 and 5MWLP1 includes a segment of a metal one layer.

In the embodiment depicted in FIGS. 5A-5C, IC device 5A1 includes active area 5AA1 and gate structures 5P4-5P7. In some embodiments, IC device 5A1 includes one or more active areas (not shown) in addition to active area 5AA1. In various embodiments, IC device 5A1 does not include one or more of gate structures 5P4-5P7 or includes one or more gate structures (not shown) in addition to gate structures 5P4-5P7.

In some embodiments, IC device 5A1 is part of an anti-fuse cell array and includes additional anti-fuse structures, gate structures, and conductive segments (not shown) configured in accordance with anti-fuse cell array 100, discussed above with respect to FIGS. 1C and 1D, or anti-fuse arrays 300A-300D, discussed above with respect to FIGS. 3A-3D.

In various embodiments, IC device 5A1 includes additional IC device elements (not shown), e.g., doped and/or epitaxial regions, wells, or isolation structures, suitable for configuring one or more combinations of active areas, gate structures, and conductive segments as discussed above.

In various embodiments, IC device 5A1 includes one or more additional conductive elements (not shown), e.g., contacts, vias, or segments of a metal diffusion, metal zero, metal one, or higher metal layer, configured as one or more electrical connections to anti-fuse bits 5B1 and 5B5.

By being configured in accordance with IC layout diagrams A1, 100, and 300A-300B, discussed above with respect to FIGS. 1A-1D and 3A-3D, and manufactured through execution of some or all of the operations of methods 200 and 400, discussed above with respect to FIGS. 2 and 4, IC device 5A1 enables the realization of the advantages discussed above with respect to IC layout diagrams A1 and 100.

Figure 6:
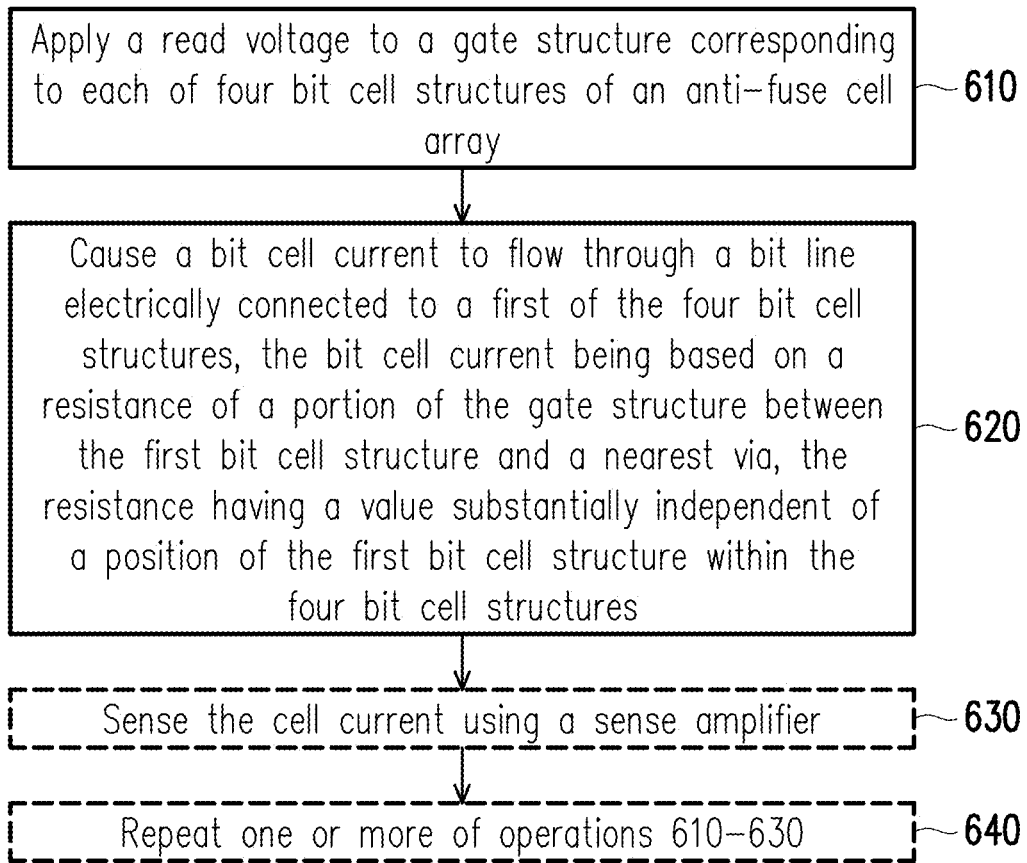
FIG. 6 is a flowchart of a method of performing a read operation on an anti-fuse cell, in accordance with some embodiments.

FIG. 6 is a flowchart of a method 600 of performing a read operation on an anti-fuse cell, in accordance with some embodiments. The operations of method 600 are capable of being performed as part of a method of operating one or more IC devices including one or more anti-fuse structures, e.g., IC device 5A1 discussed above with respect to FIGS. 5A-5C.

In some embodiments, the operations of method 600 are performed in the order depicted in FIG. 6. In some embodiments, the operations of method 600 are performed in an order other than the order depicted in FIG. 6. In some embodiments, one or more operations are performed before, between, during, and/or after performing one or more operations of method 600.

At operation 610, a read voltage is applied to a gate structure corresponding to each of four bit cell structures of an anti-fuse cell array. Applying the read voltage includes applying a reference voltage to a bit line electrically connected to a first one of the four bit cell structures. The read voltage has a read voltage level, the reference voltage has a reference voltage level, and a difference between the read voltage level and the reference voltage level produces an electric field that is sufficiently small to avoid sustainably altering dielectric material of the first bit cell structure.

In some embodiments, applying the read voltage includes one of applying signal WLP0 to the gate structure corresponding to gate region P4, applying signal WLP1 to the gate structure corresponding to gate region P7, applying signal WLP2 to the gate structure corresponding to gate region P12, or applying signal WLP3 to the gate structure corresponding to gate region P15, discussed above with respect to FIGS. 1A-1D.

In some embodiments, applying the read voltage includes applying the read voltage at one of conductive segments 5MWLP0 or 5MWLP1, discussed above with respect to FIG. 5C.

At operation 620, a bit cell current is caused to flow through the bit line electrically connected to the first bit cell structure. The bit cell current is based on a resistance of a portion of the gate structure between the first bit cell structure and a nearest via, the resistance having a value substantially independent of a position of the first bit cell structure within the four bit cell structures. Causing the bit cell current to flow includes causing the bit cell current to have a magnitude sufficiently large to be sensed using a sense amplifier.

Causing the bit cell current to flow includes turning on a switching device included in the first bit cell structure. In some embodiments, causing the bit cell current to flow includes causing bit line current IBL to flow through one of resistors RP0 or RP1 by a corresponding one of using signal WLR0 to turn on transistor B1R in anti-fuse bit B1 or using signal WLR1 to turn on transistor B5R in anti-fuse bit B5, discussed above with respect to FIGS. 1A and 1B.

In some embodiments, causing the bit cell current to flow includes using signal WLR0 to cause the bit cell current to flow in a portion of the gate structure corresponding to gate region P4 adjacent to one of anti-fuse bits B1-B4 and having length L, discussed above with respect to FIG. 1C.

In some embodiments, causing the bit cell current to flow includes using signal WLR1 to cause the bit cell current to flow in a portion of the gate structure corresponding to gate region P7 adjacent to one of anti-fuse bits B5-B8 and having length L, discussed above with respect to FIG. 1C.

In some embodiments, causing the bit cell current to flow includes using signal WLR2 to cause the bit cell current to flow in a portion of the gate structure corresponding to gate region P12 adjacent to one of anti-fuse bits B9-B12 and having length L, discussed above with respect to FIG. 1C.

In some embodiments, causing the bit cell current to flow includes using signal WLR3 to cause the bit cell current to flow in a portion of the gate structure corresponding to gate region P15 adjacent to one of anti-fuse bits B13-B16 and having length L, discussed above with respect to FIG. 1C.

In some embodiments, causing the bit cell current to flow includes causing the bit cell current to flow through a portion of one of gate structures 5P4 or 5P7, discussed above with respect to FIG. 5C.

At operation 630, in some embodiments, the cell current is sensed using the sense amplifier. In some embodiments, sensing the cell current using the sense amplifier includes determining a programmed status of the corresponding anti-fuse structure.

At operation 640, in some embodiments, one or more of operations 610-630 are repeated for at least a second bit cell structure, thereby causing bit cell currents to flow in two or more bit cell structures. In various embodiments, repeating one or more of operations 610-630 includes causing a bit cell current to flow in a second one of the four bit cell structures and/or causing a bit cell current to flow in a bit cell structure other than the four bit cell structures. In some embodiments, repeating one or more of operations 610-630 includes repeating the one or more of operations 610-630 on an anti-fuse cell array manufactured based on anti-fuse cell array 100.

By executing some or all of the operations of method 600, a read operation is performed in which gate structure portions of read current paths have the properties, and thereby the benefits, discussed above with respect to anti-fuse cell A1 and anti-fuse cell array 100.

Figure 7:
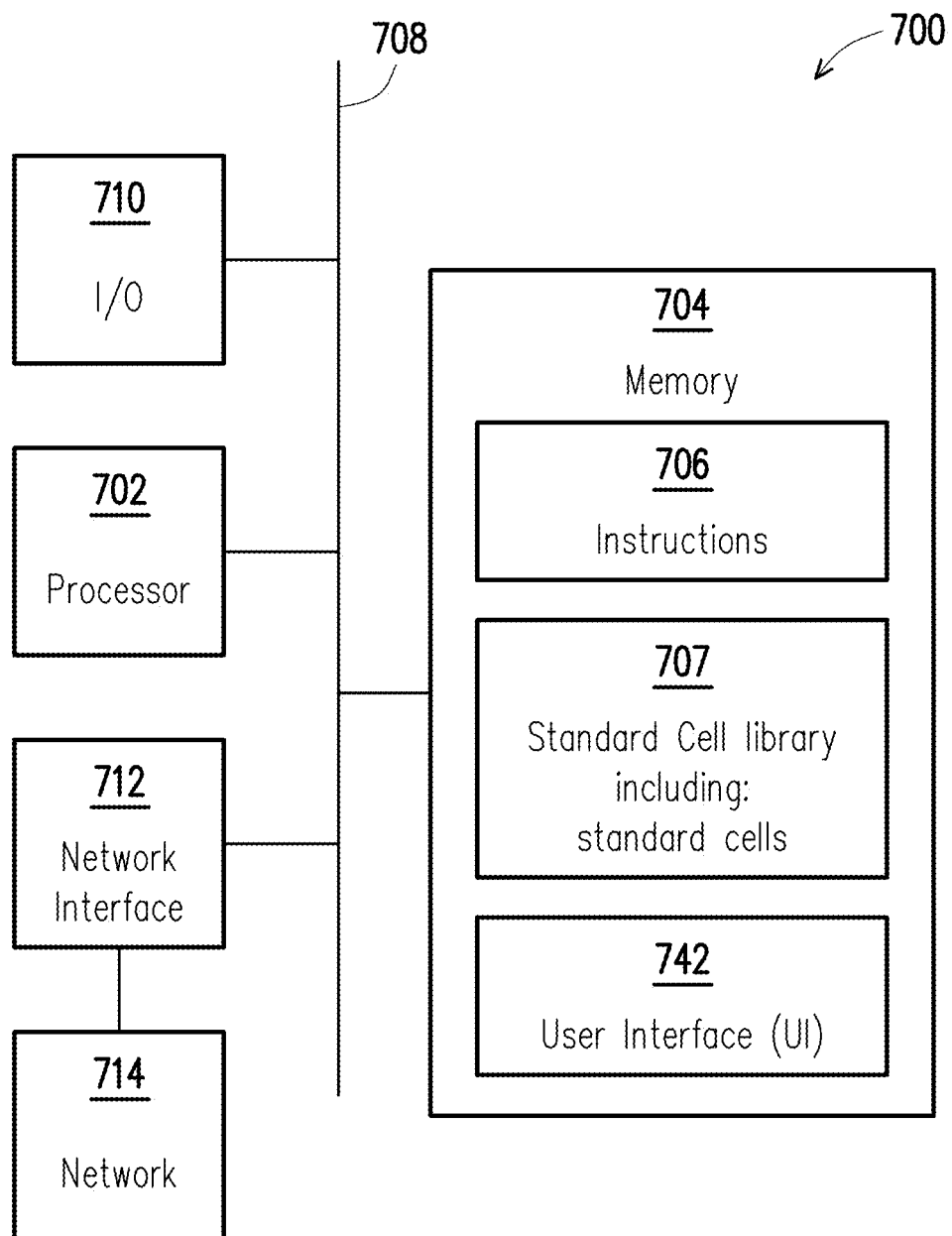
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein of designing layout diagrams representing wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., a method 900 described below with respect to FIG. 9 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein, e.g., an anti-fuse cell A1 discussed above with respect to FIGS. 1A-1D.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
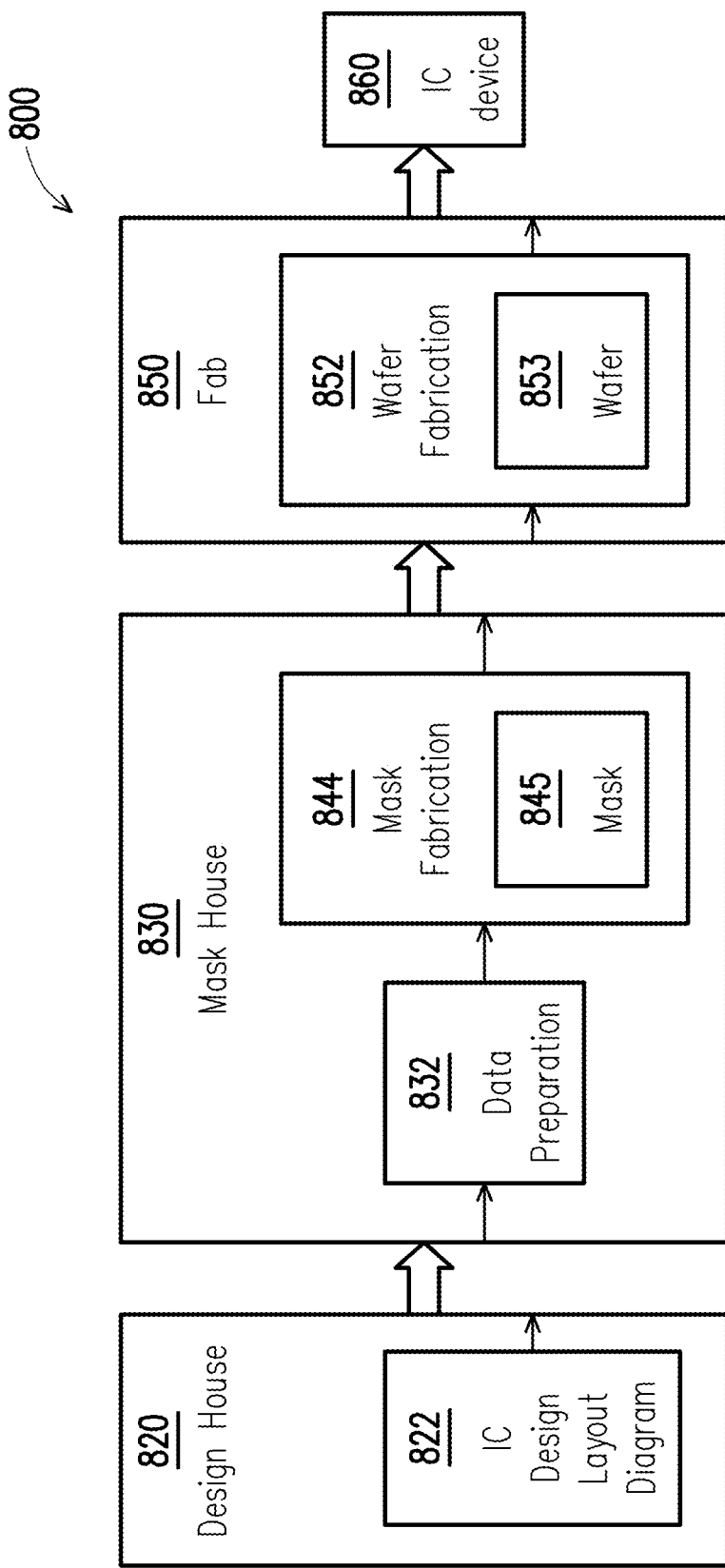
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram depicted in FIG. 1A, 1C, 1D, or 3A-3D, designed for an IC device 860, e.g., IC device 5A1, discussed above with respect to FIGS. 5A-5C. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 10, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 1045 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an anti-fuse array includes first through fourth adjacent columns of anti-fuse bits, wherein the anti-fuse bits of the first and second anti-fuse bit columns include portions of active areas of a first active area column, and the anti-fuse bits of the third and fourth anti-fuse bit columns include portions of active areas of a second active area column, a first set of conductive segment rows, wherein each row of the first set of conductive segment rows includes first and second conductive segments positioned between adjacent active areas of the first active area column and a third conductive segment positioned between adjacent active areas of the second active area column, and a second set of conductive segment rows alternating with the first set of conductive segment rows, wherein each row of the second set of conductive segment rows includes a fourth conductive segment positioned between adjacent active areas of the first active area column and fifth and sixth conductive segments positioned between adjacent active areas of the second active area column. In some embodiments, each anti-fuse bit of the anti-fuse array includes an anti-fuse structure, each first conductive segment is electrically connected to each anti-fuse structure of the first column of anti-fuse bits, each second conductive segment is electrically connected to each anti-fuse structure of the second column of anti-fuse bits, each fifth conductive segment is electrically connected to each anti-fuse structure of the third column of anti-fuse bits, and each sixth conductive segment is electrically connected to each anti-fuse structure of the fourth column of anti-fuse bits. In some embodiments, each anti-fuse bit of the anti-fuse array includes a selection transistor, each conductive segment of a first subset of the third conductive segments is electrically connected to each selection transistor of the third column of anti-fuse bits, each conductive segment of a second subset of the third conductive segments is electrically connected to each selection transistor of the fourth column of anti-fuse bits, each conductive segment of a first subset of the fourth conductive segments is electrically connected to each selection transistor of the first column of anti-fuse bits, and each conductive segment of a second subset of the fourth conductive segments is electrically connected to each selection transistor of the second column of anti-fuse bits. In some embodiments, the first subset of the third conductive segments alternates with the second subset of the third conductive segments, and the first subset of the fourth conductive segments alternates with the second subset of the fourth conductive segments. In some embodiments, the anti-fuse array includes a first metal segment overlying and electrically connected to each first conductive segment, a second metal segment overlying and electrically connected to each fourth conductive segment of the first subset of the fourth conductive segments, a third metal segment overlying and electrically connected to each fourth conductive segment of the second subset of the fourth conductive segments, a fourth metal segment overlying and electrically connected to each second conductive segment, a fifth metal segment overlying and electrically connected to each fifth conductive segment, a sixth metal segment overlying and electrically connected to each third conductive segment of the first subset of the third conductive segments, a seventh metal segment overlying and electrically connected to each third conductive segment of the second subset of the third conductive segments, and an eighth metal segment overlying and electrically connected to each sixth conductive segment. In some embodiments, each anti-fuse bit of the first anti-fuse bit column is configured to be programmed and read responsive to a first pair of signals on the first and second metal segments, each anti-fuse bit of the second anti-fuse bit column is configured to be programmed and read responsive to a second pair of signals on the third and fourth metal segments, each anti-fuse bit of the third anti-fuse bit column is configured to be programmed and read responsive to a third pair of signals on the fifth and sixth metal segments, and each anti-fuse bit of the fourth anti-fuse bit column is configured to be programmed and read responsive to a fourth pair of signals on the seventh and eighth metal segments. In some embodiments, the anti-fuse array includes a plurality of bit lines, each bit line of the plurality of bit lines being electrically coupled to active areas of each of the first and second active area columns and positioned between a row of the first set of conductive segment rows and a row of the second set of conductive segment rows.

In some embodiments, an anti-fuse array includes first through fourth adjacent columns of anti-fuse bits, wherein the anti-fuse bits of the first and second anti-fuse bit columns include portions of active areas of a first active area column and the anti-fuse bits of the third and fourth anti-fuse bit columns include portions of active areas of a second active area column, a first set of conductive segment rows, wherein each row of the first set of conductive segment rows includes first and second conductive segments coupled to the anti-fuse bits of the first and second anti-fuse bit columns and positioned between adjacent active areas of the first active area column and a third conductive segment positioned between adjacent active areas of the second active area column, and a second set of conductive segment rows alternating with the first set of conductive segment rows, wherein each row of the second set of conductive segment rows includes a fourth conductive segment positioned between adjacent active areas of the first active area column and fifth and sixth conductive segments coupled to the anti-fuse bits of the third and fourth anti-fuse bit columns and positioned between adjacent active areas of the second active area column. In some embodiments, the anti-fuse bits of the first column include first anti-fuse structures including portions of a first gate conductor electrically connected to the first conductive segments, and first selection transistors including portions of a second gate conductor electrically connected to a first subset of the fourth conductive segments, the anti-fuse bits of the second column include second selection transistors including portions of a third gate conductor electrically connected to a second subset of the fourth conductive segments, and second anti-fuse structures including portions of a fourth gate conductor electrically connected to the second conductive segments, the anti-fuse bits of the third column include third anti-fuse structures including portions of a fifth gate conductor electrically connected to the fifth conductive segments, and third selection transistors including portions of a sixth gate conductor electrically connected to a first subset of the third conductive segments, and the anti-fuse bits of the fourth column include fourth selection transistors including portions of a seventh gate conductor electrically connected to a second subset of the third conductive segments, and fourth anti-fuse structures including portions of an eighth gate conductor electrically connected to the sixth conductive segments. In some embodiments, the anti-fuse array includes a first metal segment electrically connected to the first gate conductor through each first conductive segment, a second metal segment electrically connected to the second gate conductor through each fourth conductive segment of the first subset of the fourth conductive segments, a third metal segment electrically connected to the third gate conductor through each fourth conductive segment of the second subset of the fourth conductive segments, a fourth metal segment electrically connected to the fourth gate conductor through each second conductive segment, a fifth metal segment electrically connected to the fifth gate conductor through each fifth conductive segment, a sixth metal segment electrically connected to the sixth gate conductor through each third conductive segment of the first subset of the third conductive segments, a seventh metal segment electrically connected to the seventh gate conductor through each third conductive segment of the second subset of the third conductive segments, and an eighth metal segment electrically connected to the eighth gate conductor through each sixth conductive segment. In some embodiments, the first metal segment overlies and is electrically connected to each first conductive segment through first vias, the second metal segment overlies and is electrically connected to each fourth conductive segment of the first subset of the fourth conductive segments through second vias, the third metal segment overlies and is electrically connected to each fourth conductive segment of the second subset of the fourth conductive segments through third vias, the fourth metal segment overlies and is electrically connected to each second conductive segment through fourth vias, the fifth metal segment overlies and is electrically connected to each fifth conductive segment through fifth vias, the sixth metal segment overlies and is electrically connected to each third conductive segment of the first subset of the third conductive segments through sixth vias, the seventh metal segment overlies and is electrically connected to each third conductive segment of the second subset of the third conductive segments through seventh vias, and the eighth metal segment overlies and is electrically connected to each sixth conductive segment through eighth vias. In some embodiments, each first conductive segment overlies and is electrically connected to the first gate conductor through a first via, each fourth conductive segment of the first subset of the fourth conductive segments overlies and is electrically connected to the second gate conductor through a second via, each fourth conductive segment of the second subset of the fourth conductive segments overlies and is electrically connected to the third gate conductor through a third via, each second conductive segment overlies and is electrically connected to the fourth gate conductor through a fourth via, each fifth conductive segment overlies and is electrically connected to the fifth gate conductor through a fifth via, each third conductive segment of the first subset of the third conductive segments overlies and is electrically connected to the sixth gate conductor through a sixth via, each third conductive segment of the second subset of the third conductive segments overlies and is electrically connected to the seventh gate conductor through a seventh via, and each sixth conductive segment overlies and is electrically connected to the eighth gate conductor through an eighth via. In some embodiments, the anti-fuse array includes a plurality of bit lines, wherein each bit line of the plurality of bit lines is electrically coupled to a first active area of the first active area column through a first contact positioned between the second and third gate conductors, and electrically connected to a second active area of the second active area column through a second contact positioned between the sixth and seventh gate conductors. In some embodiments, the plurality of bit lines is positioned in a same metal layer as each of the first through sixth conductive segments.

In some embodiments, an anti-fuse array includes first through fourth adjacent columns of anti-fuse bits, wherein the anti-fuse bits of the first and second anti-fuse bit columns include portions of active areas of a first active area column and the anti-fuse bits of the third and fourth anti-fuse bit columns include portions of active areas of a second active area column, a first set of conductive segment rows, wherein each row of the first set of conductive segment rows includes first and second conductive segments positioned between adjacent active areas of the first active area column and a third conductive segment positioned between adjacent active areas of the second active area column and separated from the second conductive segment by a first distance, and a second set of conductive segment rows alternating with the first set of conductive segment rows, wherein each row of the second set of conductive segment rows includes a fourth conductive segment positioned between adjacent active areas of the first active area column and fifth and sixth conductive segments positioned between adjacent active areas of the second active area column, wherein the fourth and fifth conductive segments are separated from each other by the first distance. In some embodiments, the second and third conductive segments are separated from each other by a second distance, and the fourth and fifth conductive segments are separated from each other by the second distance. In some embodiments, the first and second distances are the same. In some embodiments, the first conductive segments are aligned with each other along the first anti-fuse bit column, the second conductive segments are aligned with each other along the second anti-fuse bit column, the fifth conductive segments are aligned with each other along the third anti-fuse bit column, the sixth conductive segments are aligned with each other along the fourth anti-fuse bit column, the third conductive segments are aligned with each other along the first and second anti-fuse bit columns, and the fourth conductive segments are aligned with each other along the third and fourth anti-fuse bit columns. In some embodiments, the anti-fuse bits of the first column include first anti-fuse structures including portions of a first gate conductor, and first selection transistors including portions of a second gate conductor, the anti-fuse bits of the second column include second selection transistors including portions of a third gate conductor, and second anti-fuse structures including portions of a fourth gate conductor, the anti-fuse bits of the third column include third anti-fuse structures including portions of a fifth gate conductor, and third selection transistors including portions of a sixth gate conductor, the anti-fuse bits of the fourth column include fourth selection transistors including portions of a seventh gate conductor, and fourth anti-fuse structures including portions of an eighth gate conductor, the first conductive segments overlie and are electrically connected to the first gate conductor through first vias, alternating subsets of the fourth conductive segments overlie and are electrically connected to the second and third gate conductors through corresponding second and third vias, the second conductive segments overlie and are electrically connected to the fourth gate conductor through fourth vias, the fifth conductive segments overlie and are electrically connected to the fifth gate conductor through fifth vias, alternating subsets of the third conductive segments overlie and are electrically connected to the sixth and seventh gate conductors through corresponding sixth and seventh vias, and the sixth conductive segments overlie and are electrically connected to the eighth gate conductor through eighth vias. In some embodiments, the anti-fuse array includes a first metal segment overlying and electrically connected to the first conductive segments through ninth vias, a second metal segment overlying and electrically connected to a first subset of the alternating subsets of the fourth conductive segments through tenth vias, a third metal segment overlying and electrically connected to a second subset of the alternating subsets of the fourth conductive segments through eleventh vias, a fourth metal segment overlying and electrically connected to the second conductive segments through twelfth vias, a fifth metal segment overlying and electrically connected to the fifth conductive segments through thirteenth vias, a sixth metal segment overlying and electrically connected to a first subset of the alternating subsets of the third conductive segments through fourteenth vias, a seventh metal segment overlying and electrically connected to a second subset of the alternating subsets of the third conductive segments through fifteenth vias, and an eighth metal segment overlying and electrically connected to the sixth conductive segments through sixteenth vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An anti-fuse array comprising:
   first through fourth adjacent columns of anti-fuse bits, wherein
     the anti-fuse bits of the first and second anti-fuse bit columns comprise portions of active areas of a first active area column, and
     the anti-fuse bits of the third and fourth anti-fuse bit columns comprise portions of active areas of a second active area column;
   a first set of conductive segment rows, wherein each row of the first set of conductive segment rows comprises first and second conductive segments positioned between adjacent active areas of the first active area column and a third conductive segment positioned between adjacent active areas of the second active area column; and
   a second set of conductive segment rows alternating with the first set of conductive segment rows, wherein each row of the second set of conductive segment rows comprises a fourth conductive segment positioned between adjacent active areas of the first active area column and fifth and sixth conductive segments positioned between adjacent active areas of the second active area column.

2. The anti-fuse array of claim 1, wherein each anti-fuse bit of the anti-fuse array comprises an anti-fuse structure,
each first conductive segment is electrically connected to each anti-fuse structure of the first column of anti-fuse bits,
each second conductive segment is electrically connected to each anti-fuse structure of the second column of anti-fuse bits,
each fifth conductive segment is electrically connected to each anti-fuse structure of the third column of anti-fuse bits, and
each sixth conductive segment is electrically connected to each anti-fuse structure of the fourth column of anti-fuse bits.

3. The anti-fuse array of claim 2, wherein
each anti-fuse bit of the anti-fuse array further comprises a selection transistor,
each conductive segment of a first subset of the third conductive segments is electrically connected to each selection transistor of the third column of anti-fuse bits,
each conductive segment of a second subset of the third conductive segments is electrically connected to each selection transistor of the fourth column of anti-fuse bits,
each conductive segment of a first subset of the fourth conductive segments is electrically connected to each selection transistor of the first column of anti-fuse bits, and
each conductive segment of a second subset of the fourth conductive segments is electrically connected to each selection transistor of the second column of anti-fuse bits.

4. The anti-fuse array of claim 3, wherein
the first subset of the third conductive segments alternates with the second subset of the third conductive segments, and
the first subset of the fourth conductive segments alternates with the second subset of the fourth conductive segments.

5. The anti-fuse array of claim 3, further comprising:
a first metal segment overlying and electrically connected to each first conductive segment;
a second metal segment overlying and electrically connected to each fourth conductive segment of the first subset of the fourth conductive segments;
a third metal segment overlying and electrically connected to each fourth conductive segment of the second subset of the fourth conductive segments;
a fourth metal segment overlying and electrically connected to each second conductive segment;
a fifth metal segment overlying and electrically connected to each fifth conductive segment;
a sixth metal segment overlying and electrically connected to each third conductive segment of the first subset of the third conductive segments;
a seventh metal segment overlying and electrically connected to each third conductive segment of the second subset of the third conductive segments; and
an eighth metal segment overlying and electrically connected to each sixth conductive segment.

6. The anti-fuse array of claim 5, wherein
each anti-fuse bit of the first anti-fuse bit column is configured to be programmed and read responsive to a first pair of signals on the first and second metal segments,
each anti-fuse bit of the second anti-fuse bit column is configured to be programmed and read responsive to a second pair of signals on the third and fourth metal segments,
each anti-fuse bit of the third anti-fuse bit column is configured to be programmed and read responsive to a third pair of signals on the fifth and sixth metal segments, and
each anti-fuse bit of the fourth anti-fuse bit column is configured to be programmed and read responsive to a fourth pair of signals on the seventh and eighth metal segments.

7. The anti-fuse array of claim 1, further comprising a plurality of bit lines, each bit line of the plurality of bit lines being electrically coupled to active areas of each of the first and second active area columns and positioned between a row of the first set of conductive segment rows and a row of the second set of conductive segment rows.

8. An anti-fuse array comprising:
first through fourth adjacent columns of anti-fuse bits, wherein
the anti-fuse bits of the first and second anti-fuse bit columns comprise portions of active areas of a first active area column, and
the anti-fuse bits of the third and fourth anti-fuse bit columns comprise portions of active areas of a second active area column;
a first set of conductive segment rows, wherein each row of the first set of conductive segment rows comprises first and second conductive segments coupled to the anti-fuse bits of the first and second anti-fuse bit columns and positioned between adjacent active areas of the first active area column and a third conductive segment positioned between adjacent active areas of the second active area column; and
a second set of conductive segment rows alternating with the first set of conductive segment rows, wherein each row of the second set of conductive segment rows comprises a fourth conductive segment positioned between adjacent active areas of the first active area column and fifth and sixth conductive segments coupled to the anti-fuse bits of the third and fourth anti-fuse bit columns and positioned between adjacent active areas of the second active area column.

9. The anti-fuse array of claim 8, wherein
the anti-fuse bits of the first column comprise first anti-fuse structures comprising portions of a first gate conductor electrically connected to the first conductive segments, and first selection transistors comprising portions of a second gate conductor electrically connected to a first subset of the fourth conductive segments,
the anti-fuse bits of the second column comprise second selection transistors comprising portions of a third gate conductor electrically connected to a second subset of the fourth conductive segments, and second anti-fuse structures comprising portions of a fourth gate conductor electrically connected to the second conductive segments,
the anti-fuse bits of the third column comprise third anti-fuse structures comprising portions of a fifth gate conductor electrically connected to the fifth conductive segments, and third selection transistors comprising portions of a sixth gate conductor electrically connected to a first subset of the third conductive segments, and the anti-fuse bits of the fourth column comprise fourth selection transistors comprising portions of a seventh gate conductor electrically connected to a second subset of the third conductive segments, and fourth anti-fuse structures comprising portions of an eighth gate conductor electrically connected to the sixth conductive segments.

10. The anti-fuse array of claim 9, further comprising:
a first metal segment electrically connected to the first gate conductor through each first conductive segment;
a second metal segment electrically connected to the second gate conductor through each fourth conductive segment of the first subset of the fourth conductive segments;
a third metal segment electrically connected to the third gate conductor through each fourth conductive segment of the second subset of the fourth conductive segments;
a fourth metal segment electrically connected to the fourth gate conductor through each second conductive segment;
a fifth metal segment electrically connected to the fifth gate conductor through each fifth conductive segment;
a sixth metal segment electrically connected to the sixth gate conductor through each third conductive segment of the first subset of the third conductive segments;
a seventh metal segment electrically connected to the seventh gate conductor through each third conductive segment of the second subset of the third conductive segments; and
an eighth metal segment electrically connected to the eighth gate conductor through each sixth conductive segment.

11. The anti-fuse array of claim 10, wherein
the first metal segment overlies and is electrically connected to each first conductive segment through first vias,
the second metal segment overlies and is electrically connected to each fourth conductive segment of the first subset of the fourth conductive segments through second vias,
the third metal segment overlies and is electrically connected to each fourth conductive segment of the second subset of the fourth conductive segments through third vias,
the fourth metal segment overlies and is electrically connected to each second conductive segment through fourth vias,
the fifth metal segment overlies and is electrically connected to each fifth conductive segment through fifth vias,
the sixth metal segment overlies and is electrically connected to each third conductive segment of the first subset of the third conductive segments through sixth vias,
the seventh metal segment overlies and is electrically connected to each third conductive segment of the second subset of the third conductive segments through seventh vias, and
the eighth metal segment overlies and is electrically connected to each sixth conductive segment through eighth vias.

12. The anti-fuse array of claim 10, wherein
each first conductive segment overlies and is electrically connected to the first gate conductor through a first via,
each fourth conductive segment of the first subset of the fourth conductive segments overlies and is electrically connected to the second gate conductor through a second via,
each fourth conductive segment of the second subset of the fourth conductive segments overlies and is electrically connected to the third gate conductor through a third via,
each second conductive segment overlies and is electrically connected to the fourth gate conductor through a fourth via,
each fifth conductive segment overlies and is electrically connected to the fifth gate conductor through a fifth via,
each third conductive segment of the first subset of the third conductive segments overlies and is electrically connected to the sixth gate conductor through a sixth via,
each third conductive segment of the second subset of the third conductive segments overlies and is electrically connected to the seventh gate conductor through a seventh via, and
each sixth conductive segment overlies and is electrically connected to the eighth gate conductor through an eighth via.

13. The anti-fuse array of claim 9, further comprising a plurality of bit lines, wherein each bit line of the plurality of bit lines is electrically coupled to a first active area of the first active area column through a first contact positioned between the second and third gate conductors, and electrically connected to a second active area of the second active area column through a second contact positioned between the sixth and seventh gate conductors.

14. The anti-fuse array of claim 13, wherein the plurality of bit lines is positioned in a same metal layer as each of the first through sixth conductive segments.

15. An anti-fuse array comprising:
first through fourth adjacent columns of anti-fuse bits, wherein
the anti-fuse bits of the first and second anti-fuse bit columns comprise portions of active areas of a first active area column, and
the anti-fuse bits of the third and fourth anti-fuse bit columns comprise portions of active areas of a second active area column;
a first set of conductive segment rows, wherein each row of the first set of conductive segment rows comprises first and second conductive segments positioned between adjacent active areas of the first active area column and a third conductive segment positioned between adjacent active areas of the second active area column and separated from the second conductive segment by a first distance; and
a second set of conductive segment rows alternating with the first set of conductive segment rows, wherein each row of the second set of conductive segment rows comprises a fourth conductive segment positioned between adjacent active areas of the first active area column and fifth and sixth conductive segments positioned between adjacent active areas of the second active area column, wherein the fourth and fifth conductive segments are separated from each other by the first distance.

16. The anti-fuse array of claim 15, wherein
the second and third conductive segments are separated from each other by a second distance, and
the fourth and fifth conductive segments are separated from each other by the second distance.

17. The anti-fuse array of claim 16, wherein the first and second distances are the same.

18. The anti-fuse array of claim 15, wherein
the first conductive segments are aligned with each other along the first anti-fuse bit column,
the second conductive segments are aligned with each other along the second anti-fuse bit column,
the fifth conductive segments are aligned with each other along the third anti-fuse bit column,
the sixth conductive segments are aligned with each other along the fourth anti-fuse bit column,
the third conductive segments are aligned with each other along the first and second anti-fuse bit columns, and
the fourth conductive segments are aligned with each other along the third and fourth anti-fuse bit columns.

19. The anti-fuse array of claim 15, wherein
the anti-fuse bits of the first column comprise first anti-fuse structures comprising portions of a first gate conductor, and first selection transistors comprising portions of a second gate conductor,
the anti-fuse bits of the second column comprise second selection transistors comprising portions of a third gate conductor, and second anti-fuse structures comprising portions of a fourth gate conductor,
the anti-fuse bits of the third column comprise third anti-fuse structures comprising portions of a fifth gate conductor, and third selection transistors comprising portions of a sixth gate conductor,
the anti-fuse bits of the fourth column comprise fourth selection transistors comprising portions of a seventh gate conductor, and fourth anti-fuse structures comprising portions of an eighth gate conductor,
the first conductive segments overlie and are electrically connected to the first gate conductor through first vias,
alternating subsets of the fourth conductive segments overlie and are electrically connected to the second and third gate conductors through corresponding second and third vias,
the second conductive segments overlie and are electrically connected to the fourth gate conductor through fourth vias,
the fifth conductive segments overlie and are electrically connected to the fifth gate conductor through fifth vias,
alternating subsets of the third conductive segments overlie and are electrically connected to the sixth and seventh gate conductors through corresponding sixth and seventh vias, and
the sixth conductive segments overlie and are electrically connected to the eighth gate conductor through eighth vias.

20. The anti-fuse array of claim 19, further comprising:
a first metal segment overlying and electrically connected to the first conductive segments through ninth vias;
a second metal segment overlying and electrically connected to a first subset of the alternating subsets of the fourth conductive segments through tenth vias;
a third metal segment overlying and electrically connected to a second subset of the alternating subsets of the fourth conductive segments through eleventh vias;
a fourth metal segment overlying and electrically connected to the second conductive segments through twelfth vias;
a fifth metal segment overlying and electrically connected to the fifth conductive segments through thirteenth vias;
a sixth metal segment overlying and electrically connected to a first subset of the alternating subsets of the third conductive segments through fourteenth vias;
a seventh metal segment overlying and electrically connected to a second subset of the alternating subsets of the third conductive segments through fifteenth vias; and
an eighth metal segment overlying and electrically connected to the sixth conductive segments through sixteenth vias.

\* \* \* \* \*